US008570067B2

(12) United States Patent
Drapkin et al.

(10) Patent No.: US 8,570,067 B2
(45) Date of Patent: Oct. 29, 2013

(54) METHOD AND APPARATUS FOR CONTROLLING A COMMUNICATION SIGNAL BY MONITORING ONE OR MORE VOLTAGE SOURCES

(75) Inventors: Oleg Drapkin, Richmond Hill (CA); Grigori Temkine, Markham (CA); Marcus Ng, Toronto (CA); Kevin Yikai Liang, Cupertino, CA (US); Arvind Bomdica, Fremont, CA (US); Siji Menokki Kandiyil, San Jose, CA (US); Ming So, Danville, CA (US); Samu Suryanarayana, Sunnyvale, CA (US)

(73) Assignees: ATI Technologies ULC, Markham, Ontario (CA); Advanced Micro Devices, Inc., Sunnyvale, CA (US)

( * ) Notice: Subject to any disclaimer, the term of this patent is extended or adjusted under 35 U.S.C. 154(b) by 1634 days.

(21) Appl. No.: 11/749,002

(22) Filed: May 15, 2007

(65) Prior Publication Data
US 2008/0284468 A1     Nov. 20, 2008

(51) Int. Cl.
   H03K 19/0175    (2006.01)
(52) U.S. Cl.
   USPC .............................................. 326/80; 326/63
(58) Field of Classification Search
   USPC ................. 326/80–87; 327/108, 109
   See application file for complete search history.

(56) References Cited

U.S. PATENT DOCUMENTS

| | | | |
|---|---|---|---|
| 6,351,182 B1 | 2/2002 | Drapkin et al. | |
| 6,448,824 B1 * | 9/2002 | Rodriguez et al. | 327/74 |
| 7,205,820 B1 * | 4/2007 | Yeung et al. | 327/333 |
| 7,619,444 B1 * | 11/2009 | Shaikh et al. | 326/81 |

* cited by examiner

Primary Examiner — Thienvu Tran
(74) Attorney, Agent, or Firm — Faegre Baker Daniels LLP

(57) ABSTRACT

An integrated circuit is capable of controlling a communication signal by using power ramp controlled communication buffer logic to generate an outgoing communication signal based on a detected voltage on a voltage source. The voltage source is necessary to supply power for power ramp controlled communication buffer logic. The voltage on the voltage source may be detected using power ramp sensor logic. The outgoing communication signal is based on a core logic output signal if the detected voltage is greater than or equal to a predetermined voltage level. If, the detected voltage is less than the predetermined voltage level, the outgoing communication signal is predetermined to be one of: a tristate outgoing communication signal, a logic one outgoing communication signal and a logic zero outgoing communication signal. Power ramp controlled communication buffer logic may also generate a core logic input signal based on an incoming communication signal in response to the detected voltage.

22 Claims, 11 Drawing Sheets

METHOD AND APPARATUS FOR CONTROLLING A COMMUNICATION SIGNAL BY MONITORING ONE OR MORE VOLTAGE SOURCES

FIELD OF THE INVENTION

The invention generally relates to controlling a communication signal and, more particularly, to controlling a communication signal associated with a communication buffer of an integrated circuit.

BACKGROUND OF THE INVENTION

Electronic systems and devices such as, but not limited to computer systems, mobile devices and phones, set top boxes, printers, etc. are known to include two or more integrated circuits. An integrated circuit as used may refer to a single integrated circuit or a collection of integrated circuits or integrated circuits. Each integrated circuit may include "logic." Logic and derivatives of the term logic may include any number of integrated circuit components such as, but not limited to, the transistor. As is known in the art, integrated circuit components, such as transistors, may form logic that is capable of performing a variety of operations. Because an integrated circuit may consist of multiple integrated circuits, as used in this disclosure, references herein to logic may physically bridge or span over one or more integrated circuits or integrated circuit packages. Integrated circuits are known to communication with each other using a variety of signals. As used throughout this disclosure, the term "signal" and all derivatives thereof refer to any suitable analog or digital signal carrying information and/or data. The term signal and its derivatives may also refer to one or more voltage levels as is known in the art. For purposes of clarity, the statements made above are applicable throughout this disclosure.

The integrated circuits have core logic which is responsible for performing a particular function. The functions may be programmable or non-programmable. The integrated circuits also have communication buffer logic to communicate with other integrated circuits. The buffer logic minimally includes transmitter logic to transmit outgoing communication signals (e.g., output signals based on a core logic output signal) and/or receiver logic to receive incoming communication signals (e.g., input signals to core logic from another source such as another integrated circuit). This architecture is necessary because the core logic is generally powered using a small voltage source (also known as "a voltage supply" or as "a voltage rail") while communication signals between integrated circuits generally require logic one values that are larger than the voltage source of the core logic. For example, core logic of an integrated circuit may be powered by a 1.2 V or 1.8 V voltage source while communication signals may have a logic one value of 3.3 or 5.0 V. Accordingly, it is known to use a separate voltage source for the communication buffer logic. The use of one or more power sources in an integrated circuit results in different power domains or voltage islands within the integrated circuit.

This architecture is generally applicable to a wide variety of integrated circuits. For example, processor IC's, memory IC's, chip set IC's and ASIC's all incorporate the core logic/communication buffer logic scheme described above. A processor IC may include any suitable processing integrated circuit or integrated circuit package such as, but not limited to, a central processing unit, a graphics processing unit, processing cores within a processor, processing engines, accelerators, etc. A memory IC may include any integrated circuit or integrated circuit package capable of storing data whether volatile or non-volatile such as, for example, a DRAM. A chip set IC may include any suitable bridge integrated circuit or bridge integrated circuit package such as, but not limited to a northbridge, a southbridge and a combined northbridge+southbridge.

It is further known that electronic devices are consistently being driven to operate faster and consume less power. One way to meet these demands is to supply integrated circuits with faster clocks and smaller voltage supply levels while reducing the gate thickness of individual transistors on integrated circuits. Accordingly a variety of different types of transistors have been developed to meet this demand. For example, a first type of transistors ("1X transistors") is characterized by supporting a 1.8 V power supply and generating a 1.8 V logic one value. 1X transistors are further characterized by being designed based on, among other things, a reliability criterion that indicates how reliable the transistor will be over a period of time when exposed to a variety of voltage differences between any two terminals of the transistor. As used herein, transistors have three terminals: a gate, a first terminal and a second terminal. 1X transistors presently have a reliability criterion indicating that they will provide 10 years of reliable operation if exposed to no more than 1.8 V plus a predetermined tolerance voltage between any two terminals. The predetermined tolerance value may be any suitable percentage or voltage amount. It is not uncommon to see tolerance values expressed as 20%.

Those having ordinary skill in the art will recognize that other types of transistors may exist. For example, transistors supporting a 3.3 V power supply and generating a 3.3 V logic one value are referred to as 2X transistors. 2X transistors presently have a reliability criterion indicating that they will provide 10 years of reliable operation if exposed to no more than 3.3 V plus a predetermined tolerance voltage between any two terminals. The predetermined tolerance value may be the same as that described above with respect to 1X transistors. Similarly, transistors supporting a 5.0 V power supply and generating a 5.0 V logic one value are referred to as 3X transistors. 3X transistors presently have a reliability criterion indicating that they will provide 10 years of reliable operation if exposed to no more than 5.0 V plus a predetermined tolerance voltage between any two terminals. The predetermined tolerance value may be the same as that described above with respect to 1X transistors.

Although 1X, 2X and 3X transistors were described above with reference to 1.8 V, 3.3 V and 5.0 V respectively, it is understood that 1X, 2X and 3X transistors may be described with reference to another suitable voltage level. For example, a 1X transistor may refer to a transistor that supports a 1.2 V power supply and that generates a 1.2 V logic one value with a similar 10 year reliability criterion if exposed to no more than 1.2 V plus a predetermined tolerance range of approximately 20% between any two terminals.

Because certain transistors can only withstand a predetermined amount of voltage difference between any two terminals, engineers and circuit designers have often used more than one voltage source to supply power to an integrated circuit or to a given power domain or voltage island within an integrated circuit. A prior art example is illustrated in the schematic circuit diagram of an integrated circuit 100 of FIG. 1. More specifically, the integrated circuit 100 of FIG. 1 illustrates one example of prior art communication buffer logic 102. Communication buffer logic 102 is illustrated as including: transmitter logic 104 and pre-buffer logic 106 where the transmitter logic 104 is capable of generating an outgoing communication signal 128. Although not illustrated, one having ordinary skill in the art will recognize that communication buffer logic 102 may include receiver logic that is capable of receiving incoming communication signals from any other suitable source (e.g., from another integrated circuit). In other embodiments, pre-buffer logic 106 (or just voltage range translation logic 112) may be part of the core logic (not illustrated). The pre-buffer logic 106 and the transmitter logic 104 are illustrated as being coupled to two voltage sources: a first voltage source (VDD_1) 108 operating at, for example, 3.3. V and a second voltage source (VDD_2) 110 operating at, for example, 1.8 V. It is understood that other voltage sources may supply power to the remainder of the integrated circuit. For example, core logic may have a third voltage source operating at, for example, 1.2 V.

Pre-buffer logic 106 includes voltage range translator logic 112, a first inverter circuit I1 and a second inverter circuit I2. The voltage range translator logic 112 is coupled to receive at least one core logic output signal 118 from the core logic. The at least one core logic output signal 118 may have a logic one value at any suitable voltage level (e.g., 1.2 V). In one embodiment, the at least one core logic output signal 118 has a logic one value such that the voltage range translator logic 112 may be implemented using 1X transistors. Core logic may be any suitable logic capable of issuing at least one core logic output signal 118 for controlling the output of the transmitter logic 104. As is known, the at least one core logic output signal 118 may include control information and/or transmission information. The control information may enable or disable the transmitter logic 104 and/or receiver logic (not shown). For example, the transmitter logic 104 may be disabled when receiver logic is receiving incoming communication signals. The transmission information may be transmitted in the outgoing communication signal 128 by the transmitter logic 104.

Based on the at least one core logic output signal 118, the voltage range translator logic 112 generates a first translated signal 120 and a second translated signal 122. The first translated signal 120 is input to the first inverter circuit I1 having the first voltage source 108 as its high power supply and having the second voltage source 110 as its low power supply. The second translated signal 122 is input to the second inverter circuit I2 having the second voltage source 110 as its high power supply and having the ground as its low power supply. The first translated signal 120 is characterized as having a voltage range of VDD_2 to VDD_1. That is, a logic zero is represented by a voltage level of VDD_2 while a logic one is represented by a voltage level of VDD_1. The second translated signal 122 is characterized as having a voltage range of 0 V to VDD_2. That is, a logic zero is represented by a zero voltage while a logic one is represented by a voltage level of VDD_2. Accordingly, both of the first and second inverter circuits I1 and I2 may be implemented using 1X transistors.

When the at least one core logic output signal 118 contains transmission information for communication in the outgoing communication signals 128, the first and second translated signals 120 and 122 mirror, match or otherwise mimic the logic states of the transmission information in the at least one core logic output signal 118. However, when the at least one core logic output signal 118 contains control information indicating that transistor logic 104 should be disabled, the first and second translated signals 120 and 122 may take any suitable form to suitable control (and disable) the transmitter logic 104. In the event that the communication buffer logic 106 includes receiver logic (not shown), the pre-buffer logic may supply the first and second pre-buffer logic output control signals 124 and 126 to the receiver logic to enable or disable it based on the control information in the at least one core logic output control signal 118.

The first inverter circuit I1 generates a first pre-buffer logic output control signal 124 based on the first translated signal 120. Similarly, the second inverter circuit I2 generates a second pre-buffer logic output control signal 126 based on the second translated signal 122. Each inverter circuit I1 and I2 performs the logical inversion function to its input in generating the above corresponding outputs, the first and second pre-buffer logic output control signals 124 and 126. The first and second pre-buffer logic output control signals 124 and 126 are used to suitably drive transmitter logic 104 based on the information present in the at least one core logic output signal 118. In this manner, the first and second pre-buffer logic output control signal are a massaged form (that is, a translated form) of the at least one core logic output signal 118.

Transmitter logic 104 is coupled to the pre-buffer logic 106 and receives the first pre-buffer logic output signal 124 and the second pre-buffer logic 126. Transmitter logic 104 includes a plurality of 1X transistors. As used herein, transistors have two terminals and a gate, wherein the gate may be termed a third terminal. Transistors may be implemented in any suitable technology such as MOSFET technology. Transmitter logic 104 includes first pmos transistor P1, second pmos transistor P2, first nmos transistor N1 and second nmos transistor N2 coupled in a cascaded fashion: the first terminal of P1 is coupled to the first voltage source 108; the gate of P1 is coupled to receive the first pre-buffer logic output control signal 124; the second terminal of P1 is coupled to the first terminal of P2; the gate of P2 is coupled to the second voltage source 110 and to the gate of N1; the second terminal of P2 is coupled to the first terminal of N1; the second terminal of N1 is coupled to the first terminal of N2; the gate of N2 is coupled to the second pre-buffer logic output control signal 126; the second terminal of N2 is coupled to the ground. The output of transmitter logic 104, termed outgoing communication signals 128, is the voltage signal seen at the second terminal of P2 and the first terminal of N1. The first and second pre-buffer logic output control signals 124 and 126 control the transmitter logic 104 by controlling the gates of P1, P2, N1 and N2. Accordingly, when the core logic wishes to communicate information to, for example, another integrated circuit, the outgoing communication signal 128 matches the logic states of the transmission information associated with the at least one core logic output signal 118 but is at a higher voltage level. In this embodiment, the outgoing communication logic 128 has a logic one value of VDD_1 (i.e., 3.3 V).

FIG. 2 illustrates a block diagram of integrated circuit 200 similar to that of integrated circuit 100 of FIG. 1 with at least one core logic 202 and two different communication buffer logic rings: communication buffer logic ring_0 with power domain_0 204 and communication buffer logic ring_1 with power domain_1 206. Power domain_0 is associated with one voltage source (e.g., 3.3 V) while power domain_1 is associated with another voltage source (e.g., 5.0V). The at least one core logic 202 may be associated with one or more corresponding voltage sources and may send core logic output signals to one or more communication buffer logic units 102. In this embodiment, the term "unit" is merely used to differentiate between each communication buffer logic 102. Each of the communication buffer logic rings 204 and 206 includes a plurality of communication buffer logic units 102 as illustrated in FIG. 1. Because each communication buffer logic unit 102 may communicate with one or more other integrated circuits, integrated circuit 200 is a versatile component of a electronic system requiring communication among a plurality of integrated circuits that require communication signals at either the voltage level associated with power domain_0 or the voltage level associated with power domain_1.

It is known that power domains can be characterized as having three operational modes. During a normal operation mode, all power supplies have sufficiently ramped up from 0 V to the voltage level at which they are designed to supply power. During ramp up operation mode, the power supplies are increased from 0 V to the voltage level at which they are designed to supply power. Conversely, during ramp down operation mode, the power supplies are decreased from the voltage level at which they are designed to supply power to 0 V.

Turning back to the prior art integrated circuit 100, during normal operation, the communication buffer logic 102 properly and accurately operates to deliver the correct outgoing communication signals 128 (and to receive and communicate to the core logic the correct incoming communication signals by way of the receiver logic, not shown). However, during ramp up operation mode and during ramp down operation mode, the voltage levels of the first voltage source 108 and the second voltage source 110 may cause the communication buffer logic 102 to act improperly and/or inaccurately thereby resulting in improper outgoing communication signals 128. The ramping voltage levels similarly and adversely affect the integrity of information contained within the incoming communication signals received by the receiver logic, not shown. This is complicated further because each of the voltage sources for the communication buffer logic 102 (and/or for the remainder of the integrated circuit 100, such as for example core logic) may be independently ramping up or down.

As a result of this sporadic, improper and inaccurate behavior of the communication buffer logic 102, the outgoing communication signals 128 transmitted by transmitter logic 104 may be improper and cause glitches or domino-effect errors for other integrated circuits that receive and rely on information contained therein. Although not specifically shown, if the communication buffer logic 102 includes receiving logic, the voltage ramping up and/or down of the first and second voltage sources 108 and 100 may further cause the core logic to receive inaccurate core logic input signals sent from other integrated circuits.

One prior art solution to the above referenced improper and inaccurate behavior of communication buffer logic 102 includes the use of external switches (e.g., weak pull-up transistors if there is a need to provide a logic one to another integrated circuit or weak pull down transistors if there is a need to provide a logic zero to another integrated circuit) that were placed alongside the trace or metal of a printed circuit board (PCB) communicating the outgoing communication signals 128 to another integrated circuit. The external switches are not only expensive, but cause additional signal integrity issues due to the difficulties of matching the impedance of the switch to the impedance of the trace. Because it is nearly impossible to properly match the impedance of the switch to that of the trace, the communication signal integrity was degraded due to reflection of the signals.

Accordingly, a need exists to correct the behavior of integrated circuits and specifically the communication buffer logic portions of integrated circuit during ramping periods such that communication signals may not cause other errors throughout the remainder of a system. A need further exists to provide such a solution while avoiding the use of external switches that cause further signal degradation.

BRIEF DESCRIPTION OF THE DRAWINGS

The invention will be more readily understood in view of the following description when accompanied by the below figures and wherein like reference numerals represent like elements.

DETAILED DESCRIPTION

Figure 1:
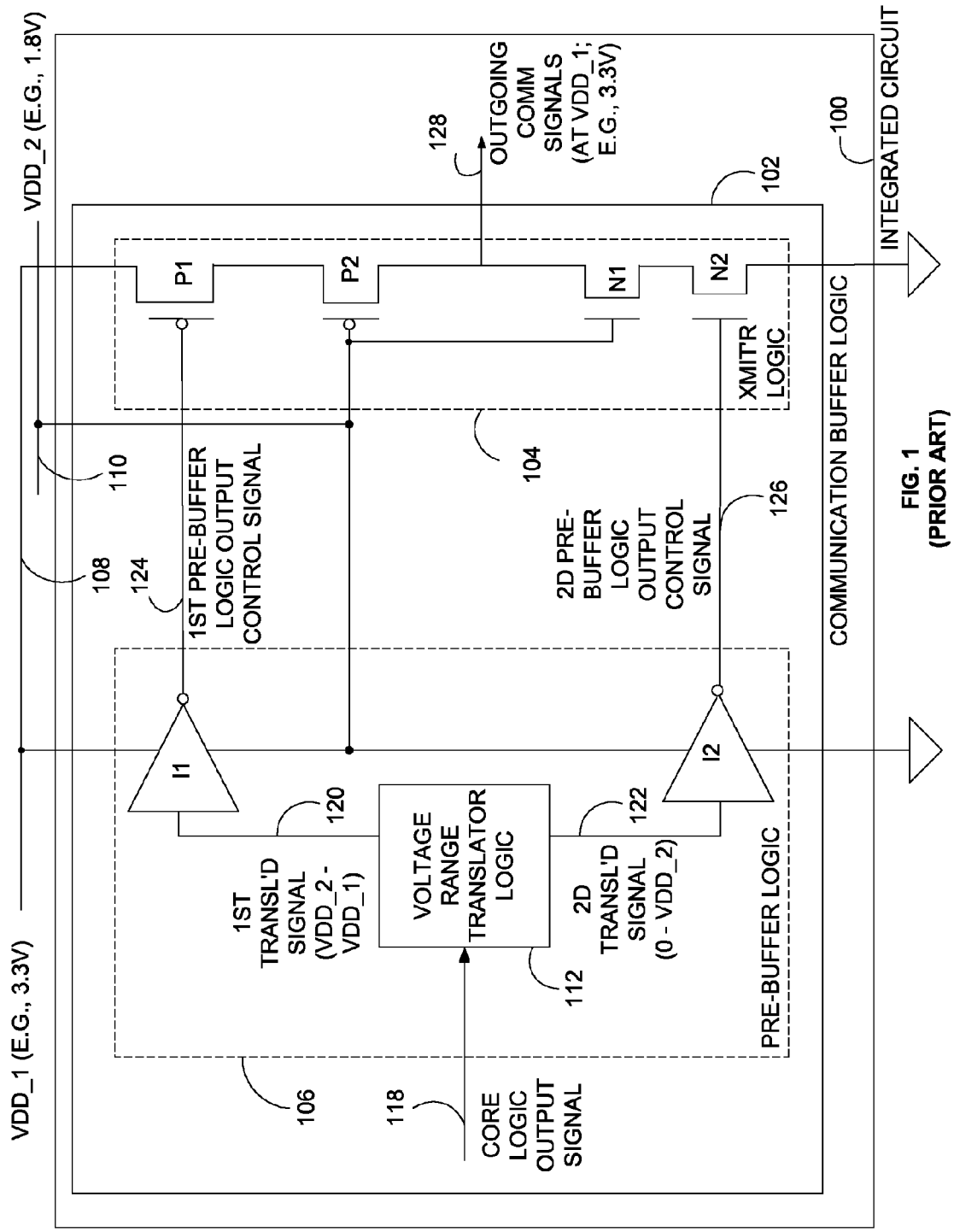
FIG. 1 is a schematic block diagram and circuit diagram of an integrated circuit having prior art communication buffer logic 102 capable of generating an outgoing communication signal.
Figure 2:
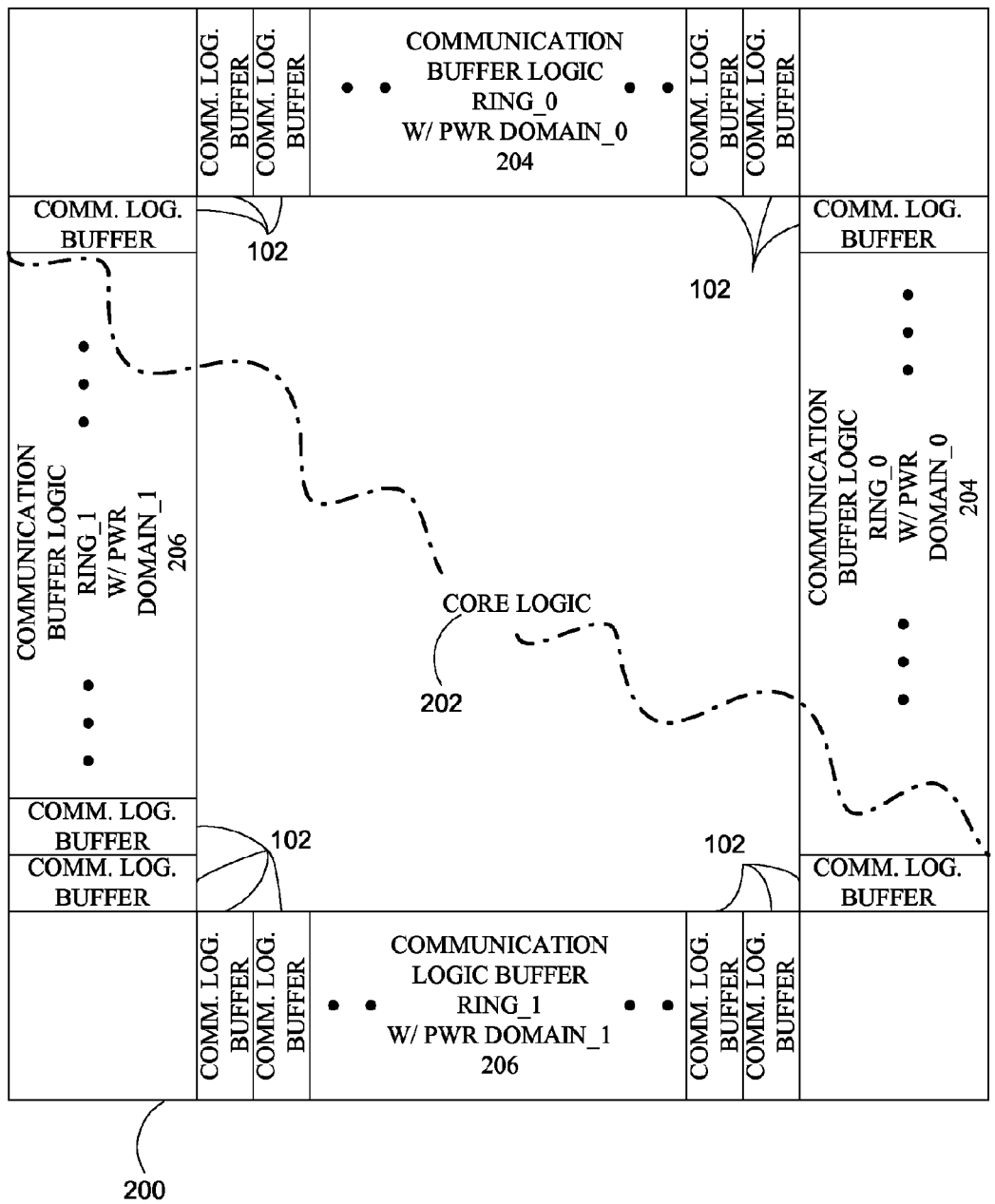
FIG. 2 is a block diagram of an integrated circuit having at least one core logic and two different communication buffer logic rings in accordance with the prior art.

Generally, the present disclosure provides a method and apparatus for controlling a communication signal such as an outgoing or incoming communication signal from one integrated circuit to another integrated circuit. Outgoing and incoming communication signals are transmitted from and/or received by power ramp controlled communication buffer logic. The power ramped controlled communication buffer logic receives power from at least one voltage source. In one embodiment, this may be accomplished by providing power ramp controlled communication buffer logic that generates an outgoing communication signal in response to the detected voltage level(s) on the voltage source(s). Power ramp sensor logic may be supplied to detect voltage levels on the voltage source(s). When the detected voltage level(s) are greater than or equal to a predetermined point, the power ramp controlled communication buffer logic generates an outgoing communication signal based on a core logic output signal. However, when the detected voltage level(s) are less than the predetermined point, the power ramp controlled communication buffer logic generates a predetermined outgoing communication signal such as a tristated outgoing communication signal, a logic one outgoing communication signal or a logic zero outgoing communication signal.

In one embodiment, the power ramp controlled communication buffer logic includes controller logic and power ramp controlled transmitter logic wherein the controller logic controls the power ramp controlled transmitter logic to generate the outgoing communication signal based on at least one controller logic output control signal. The at least one controller logic output control signal is based on the at least one core logic output signal and the detected voltage level(s) of the voltage sources, as detected by the power ramp sensor logic.

In another embodiment, the power ramp controlled communication buffer logic receives an incoming communication signal and generates a core logic input signal in response to the detected voltage level(s) on the voltage source(s). Power ramp sensor logic may be used to detect voltage levels on the voltage source(s). When the detected voltage level(s) are greater than or equal to a predetermined point, the power ramp controlled communication buffer logic generates the core logic input signal based on incoming communication signal. However, when the detected voltage level(s) are less than the predetermined point, the power ramp controlled communication buffer logic generates a predetermined core logic input signal such as a tristated core logic signal, a logic one core logic input signal or a logic zero core logic input signal.

In one embodiment, the power ramp controlled communication buffer logic is capable of both generating an outgoing communication signal and a core logic input signal based on the detected voltage level(s). In this embodiment, the power ramp controlled communication buffer logic may include controller logic, power ramp controlled transmitter logic and power ramp controller receiver logic.

In the following detailed description, numerous specific details are set forth in order to provide a thorough understanding of the present disclosure. It will be apparent to one of ordinary skill in the art, however, that these specific details need not be used to practice the present disclosure. In other instances well-known structures, interfaces and processes have not been shown or described in detail in order not to unnecessarily obscure the present invention.

Figure 3:
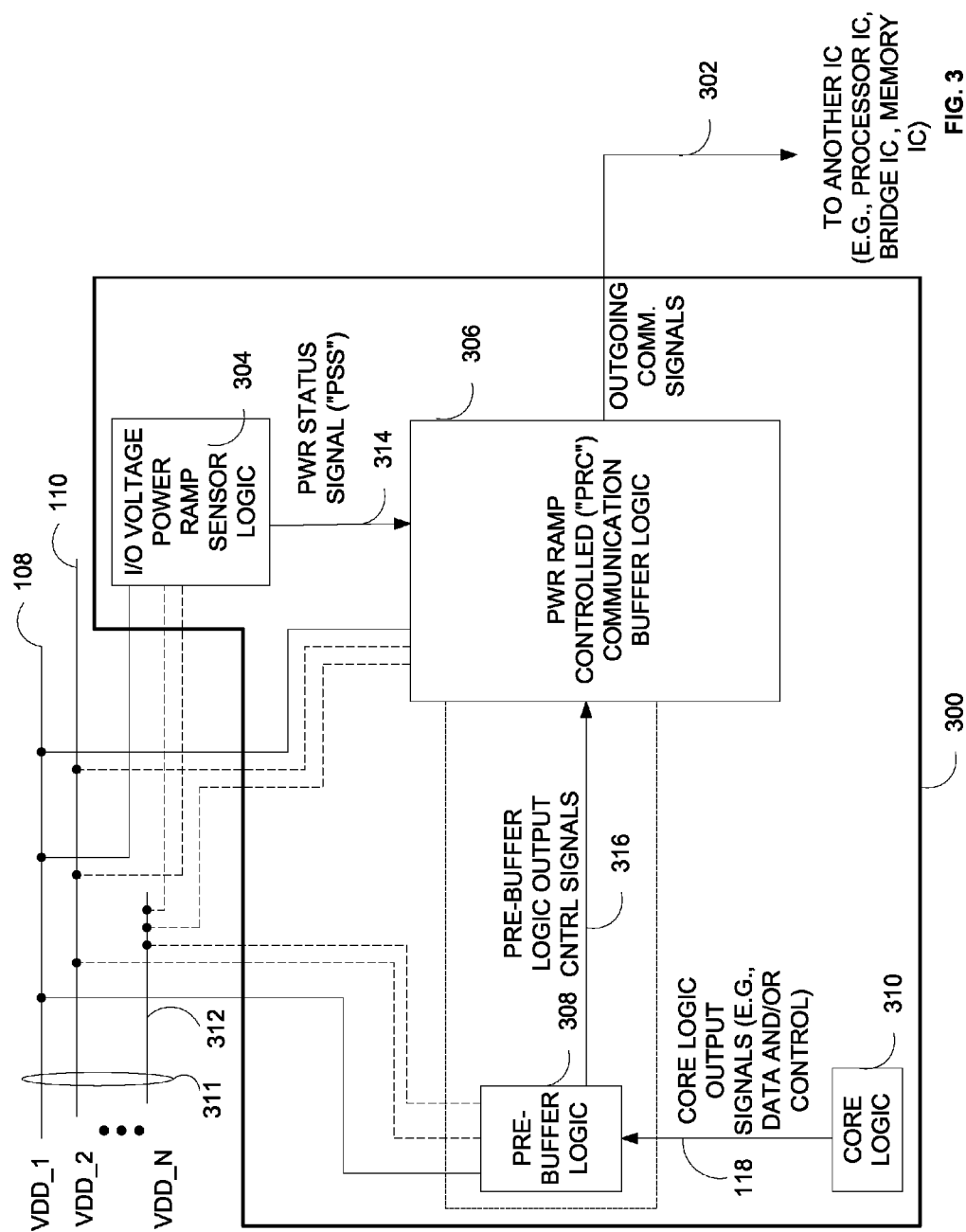
FIG. 3 is a block diagram of an integrated circuit illustrated as having core logic, pre-buffer logic, power ramp sensor logic and power ramp controlled communication buffer logic in accordance with one embodiment of the present disclosure.

FIG. 3 is a block diagram of an integrated circuit 300 capable of generating outgoing communication signals 302 having core logic 310, pre-buffer logic 308, I/O voltage power ramp sensor logic 304 and power ramp controlled communication buffer logic 306 in accordance with one embodiment of the present disclosure. Although the pre-buffer logic 308 is illustrated as being separate logic one having skill in the art will recognize that the pre-buffer logic 308 may be a component part of either the power ramp controlled communication logic 306 or the core logic 310 in another embodiment.

I/O voltage power ramp sensor logic 304 is coupled to at least one I/O voltage source 311. For example, power ramp sensor logic 304 is coupled to at least one of: a first voltage source (VDD_1) 108, a second voltage source (VDD_2), . . . , and an N-th voltage source (VDD_N) 312. Similarly, each of the pre-buffer logic 308 and the power ramp controlled communication buffer 306 is coupled to at least the same at least one voltage source 311 as the power ramp sensor logic 304. Core logic 310 may be coupled to any suitable voltage source. Because the core logic voltage source need not have the same voltage level as the at least one voltage source 311 coupled to the above-listed components of IC 300, the specific voltage source for core logic 310 is not illustrated.

In operation, power ramp sensor logic 304 detects a voltage level of each of the at least one voltage source 311 using known techniques. Power ramp sensor logic 304 also generates a power status signal 314 based on the detected voltage level for each of the at least one voltage source 311. The power status signal 314 indicates whether each of the detected voltages is "high enough" so that the power ramp controlled communication buffer logic 306 (and, in one embodiment, its related pre-buffer logic 308) can properly transmit outgoing communication signals 302. In one embodiment, the power status signal 314 is in a first state (e.g., a logic zero state) when the detected voltage level for each of the at least one voltage source 311 is below a corresponding predetermined voltage level. In the same embodiment, the power status signal 314 is in a second state (e.g., a logic one state) when the detected voltage level for each of the at least one voltage source 311 is greater than or equal to the corresponding predetermined voltage level.

The predetermined voltage level for each of the at least one voltage source 311 is associated with a predetermined point in a voltage ramp (that is, a voltage ramp up or a voltage ramp down). The predetermined point in the ramp is the point at which the voltage on each of the at least one voltage source 311 is sufficiently high for normal operation. For example, if power ramp controlled communication buffer logic 306 includes transistors, the predetermined point corresponds to the voltage level in the ramp that will safely turn on the transistors. Voltages lower than these predetermined points in the ramp are not sufficient for normal operation of the transistors.

Power ramp controlled communication buffer logic 306 receives the power ramp status signal 314 and pre-buffer logic output control signals 316. As described generally with respect to FIG. 1, the pre-buffer logic output control signals 316 are based on the at least one core logic output signal 118 from core logic 310. Additional details are provided below for the pre-buffer logic 308. Based on the state of the power ramp status signal 314, the power ramp controlled communication buffer logic 306 generates an outgoing communication signal 302. The outgoing communication signal 302 may be transmitted or otherwise communicated with an other integrated circuit (not shown) using known techniques. In one embodiment, integrated circuit 300 and the another integrated circuit (not shown) may be processors such as, but not limited to, a central processing unit, a graphics processing unit, a processing engine, a processing core of a processing unit, an accelerator, etc. The outgoing communication signal 302 is a predetermined outgoing communication signal when the power status signal 314 is in the first state. The predetermined outgoing communication signal may be one of: a tristated outgoing communication signal (i.e., a high impedance outgoing communication signal), a logic one outgoing communication signal and a logic zero outgoing communication signal. When the power status signal 314 is in the second state, the outgoing communication signal 302 is based on the at least one core logic output signal 310 (e.g., based on the transmission information associated with the at least one core logic output signal 310).

In other words, when the power ramp sensor logic 304 detects that the voltage levels on the at least one voltage source 311 are not sufficiently high, the power ramp controlled communication buffer logic 306 is not allowed to generate outgoing communication signals 302 based on the at least one core logic output signal 118 alone. Instead, power ramp controlled communication buffer logic 306 places the outgoing communication signals 302 in a predetermined state based on at least the power status signal 314. In one embodiment, the specific type of predetermined outgoing communication signal can be chosen based on the circuit designer's knowledge of the integrated circuits to which the outgoing communication signals 302 will be sent.

Figure 4:
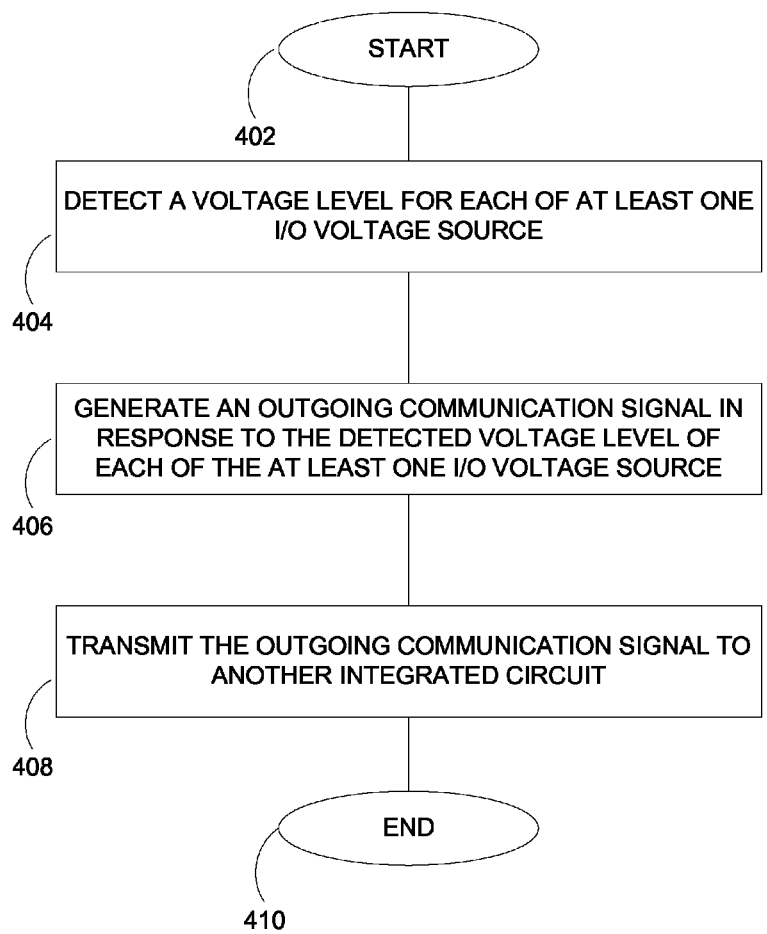
FIG. 4 is a flow chart illustrating one example of a method of controlling a communication signal in accordance with one embodiment of the present disclosure.

FIG. 4 is a flow chart illustrating one example of a method of controlling a communication signal, specifically an outgoing communication signal, in accordance with one embodiment of the present disclosure. The method begins in block 402 where, for example, core logic generates at least one core logic output signal in accordance with the above disclosure. The method then continues in block 404, where a voltage level for each of at least one I/O voltage source is detected. In one embodiment, a power status signal based on the detected voltage levels is generated. The state of the power status signal may be used to indicate the detected voltage levels. In one embodiment, the voltage level is detected by power ramp sensor logic 304 as described in FIG. 3 or by any other suitable logic.

The method also includes block 406 where an outgoing communication signal is generated in response to the detected voltage level of each of the at least one voltage source. In one embodiment, the generation of the outgoing communication signal is in response to the power status signal. In another embodiment, the generation of the outgoing communication signal is also based on the at least one core logic output signal. This may be performed by the power ramp controlled communication buffer logic 306 as described in FIG. 3 or by any other suitable logic.

In one embodiment, the outgoing communication signal is a predetermined outgoing communication signal such as a tristated outgoing communication signal, a logic zero outgoing communication signal and a logic one outgoing communication signal. The outgoing communication signal is the predetermined outgoing communication signal when the detected voltage level for each of the at least one voltage source is below a corresponding predetermined voltage level. Conversely, the outgoing communication signal is based on the at least one core logic output signal when the detected voltage level for each of the at least one voltage source is greater than or equal to a corresponding predetermined voltage level. The predetermined voltage level may be the same as described above with reference to FIG. 3. In block 408, the method includes transmitting the outgoing communication signal to another integrated circuit. The transmission may use any suitable technique known in the art. Finally, the method concludes in block 410 where the transmitted outgoing communication signal is used by the another integrated circuit for any suitable purpose.

Figure 5:
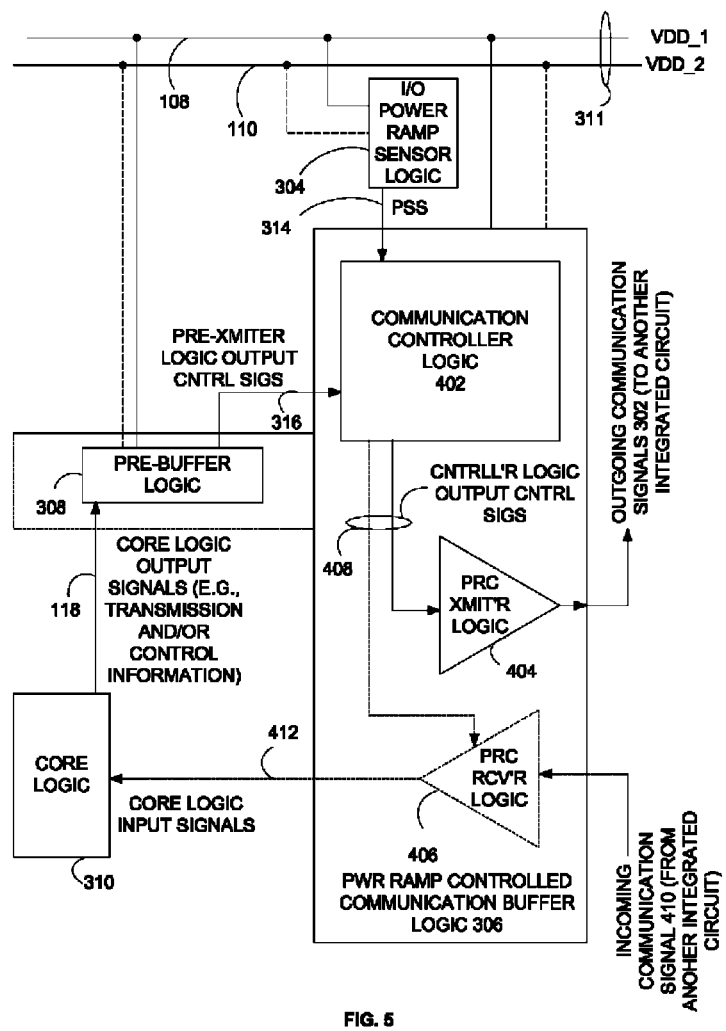
FIG. 5 is a more detailed block diagram of one embodiment of the integrated circuit illustrated in FIG. 3 and further including transmitter logic and/or receiver logic as a component of the power ramp controlled communication buffer logic.

FIG. 5 is a more detailed block diagram of one embodiment of the integrated circuit illustrated in FIG. 3. The integrated circuit 500 includes power ramp sensor logic 304, power ramp controlled communication logic 306, pre-buffer logic 308 and core logic 310. The integrated circuit 500 is coupled to at least one voltage source 311; namely at least one of a first voltage source (VDD_1) 108 and a second voltage source (VDD_2) 110. Other sources may be provided and detected, however. Power ramp controlled communication buffer logic 306 includes communication controller logic 402 and at least one of: power ramp controlled transmitter logic 404 and power ramp controlled receiver logic 406. The power ramp sensor logic 304 and core logic 310 operate in accordance with the description above with respect to FIG. 3.

Pre-buffer logic 308 is again illustrated as separate logic but may be a component part of either core logic 310 or power ramp controlled communication buffer logic 306. Pre-buffer logic 308 receives the at least one core logic output signal 118 from the core logic and generates therefrom at least one pre-buffer logic output control signal 316. The pre-buffer logic 308, in one embodiment, takes the form of pre-buffer logic 106 of FIG. 1. One having ordinary skill in the art will recognize that the pre-buffer logic 308 may take any other suitable form to condition, massage or otherwise transform the at least one core logic output signal 118 for communication with one or more components of the power ramp controlled communication buffer 306 such as, for example, the communication controller logic 402, the power ramp controlled transmitter logic 404, and in one embodiment, the power ramp controller receiver logic 406. As illustrated, the pre-buffer logic 308 is coupled to the at least one voltage source 311.

Communication controller logic 402 is coupled to receive the power status signal 314 and the at least one pre-buffer logic output control signal 316. Communication controller logic generates at least one controller logic output control signal 408 to control power ramp controlled transmitter logic 404, wherein the at least one controller logic output control signal 408 is based on the at least one core logic output signal 118 (i.e., it is based on the at least one pre-buffer logic output control signal 316 which, in turn, is based on the at least one core logic output signal 318) and in response to the power status signal 314 which, in turn, is based on the at least one detected voltage level of the at least one voltage source 311). Power ramp controlled transmitter logic 404 receives the at least one controller logic output control signal 408 and is either disabled (if so instructed by control information from the at least one core logic output signal 118) or generates the outgoing communication signal 302 based on the (transmission information of the) at least one controller logic output control signal 408. As provided in reference to FIG. 3, the outgoing communication signal 302 is either a predetermined outgoing communication signal (e.g., during voltage ramping periods) or is based on the core logic output control signal 118.

In an embodiment where the power ramp controlled communication buffer logic 306 includes only a power ramp controlled receiver logic 406 in place of the power ramp controlled transmitter logic 404, or in an embodiment where the power ramp controlled communication buffer logic 306 includes both power ramp controller transmitter logic 404 and power ramp controlled receiver logic 306, the communication controller logic 402 generates at least one controller logic output control signal 408 in response to the power status signal 314 to control power ramp controlled receiver logic 404. Power ramp controlled receiver logic 406 receives the at least one controller logic output control signal 408 and an incoming communication signal 410 from another integrated circuit (not shown). Like the outgoing communication signal 302, the incoming communication signal may have a logic one value greater than the voltage level of the core logic voltage source (not shown). The power ramp controlled logic 406 may include related logic that functions during normal operation to transform the voltage levels such that the output of the power ramp controlled receiver logic 406 (that is, core logic input signal 412) has a logic one voltage level that corresponds to the voltage level of core logic voltage source or any other suitable level.

In response to the at least one controller logic output control signal 408, the power ramp controlled receiver logic 406 may perform the transformation described above during normal operational mode (e.g., when the power status signal is in the second state) and send the core logic input signal to core logic 310 for further processing in accordance with any information contained within the signal. However, during voltage ramping modes (e.g., when the power status signal is in the first state), the power ramp controlled receiver logic 406 may generate predetermined core logic input signals in the same manner that the power ramp controller logic 404 generates a predetermined outgoing communication signal 302. In other words, the power ramp controlled receiver logic 406 may generate one of: a tristated core logic input signal, a logic one core logic input signal and a logic zero core logic input signal when the power status signal is in a first state. This avoids degrading the integrity of the information conveyed to core logic 310 from the incoming communication signal 410.

Figure 6:
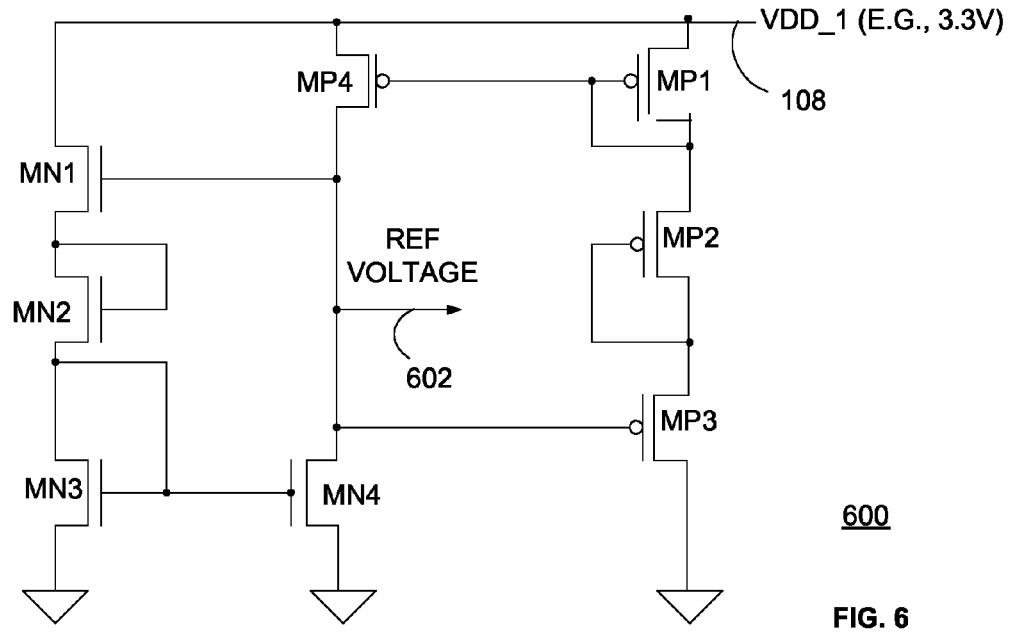
FIG. 6 is a first portion of a schematic diagram of power ramp sensor logic in accordance with one embodiment of the present disclosure.

Before turning to FIG. 6, it is noted that FIG. 5 also depicts a system comprising two integrated circuits. The first is an integrated circuit comprising core logic 310, pre-buffer logic 308, power ramp sensor logic 304 and power ramp controlled communication buffer logic 306. The second integrated circuit is not illustrated but is shown to be the circuit that sends incoming communication signal 410 and/or receives outgoing communication signal 302. The second integrated circuit may be any suitable circuit such as, for example, integrated circuit 100 or a circuit similar to the first integrated circuit in FIG. 5. Thus, the present disclosure contemplates a system including two integrated circuits that operate in the manner described herein and allow for communication therebetween.

Figure 7:
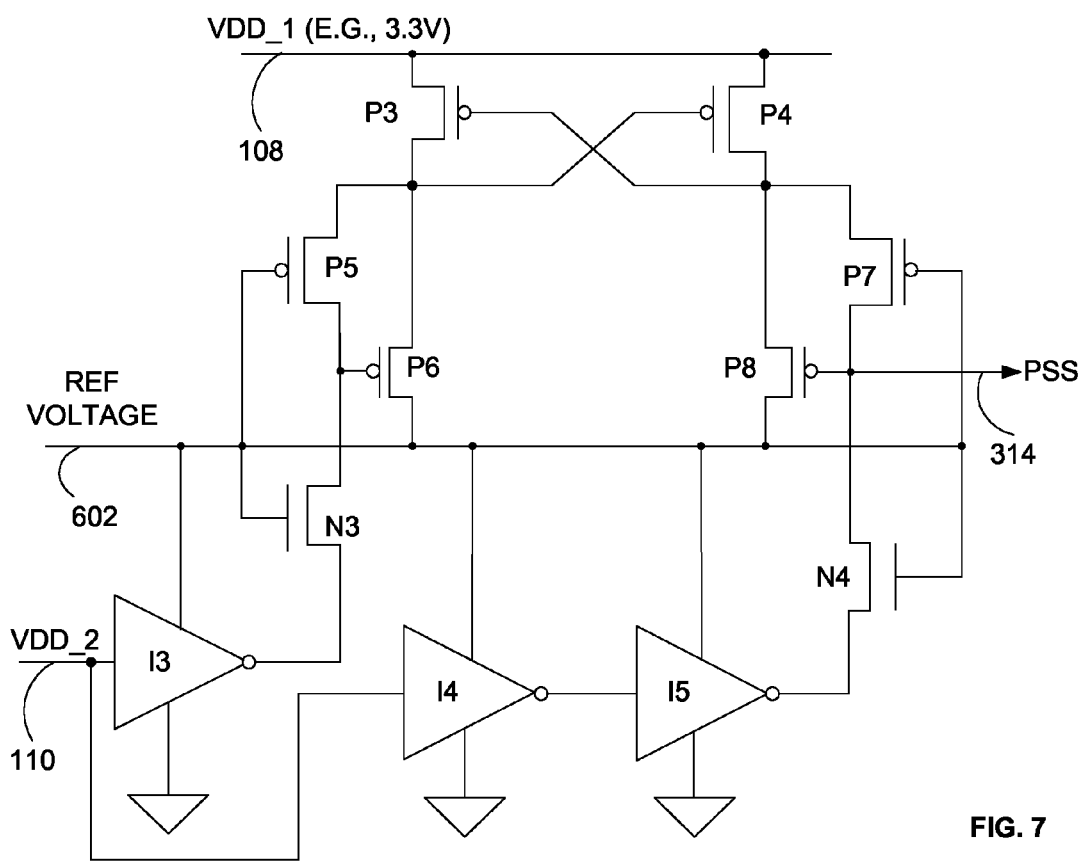
FIG. 7 is a final portion of a schematic diagram of power ramp sensor logic in accordance with FIG. 6.
Figure 11:
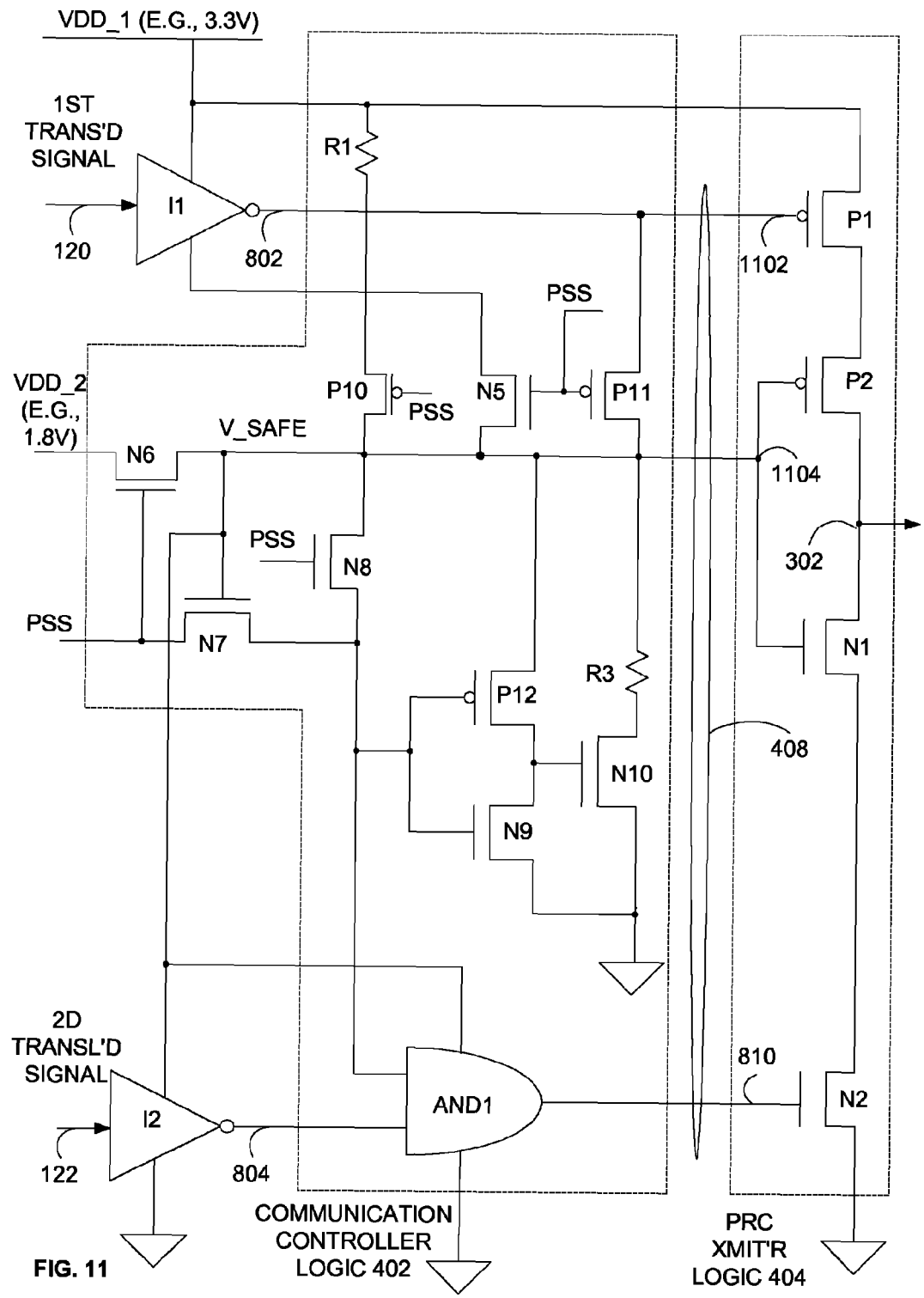
FIG. 11 is a more detailed block diagram and schematic diagram of one embodiment of pre-buffer logic, communication controller logic and power ramp controlled transmitter logic capable of generating a logic one outgoing communication signal.
Figure 12:
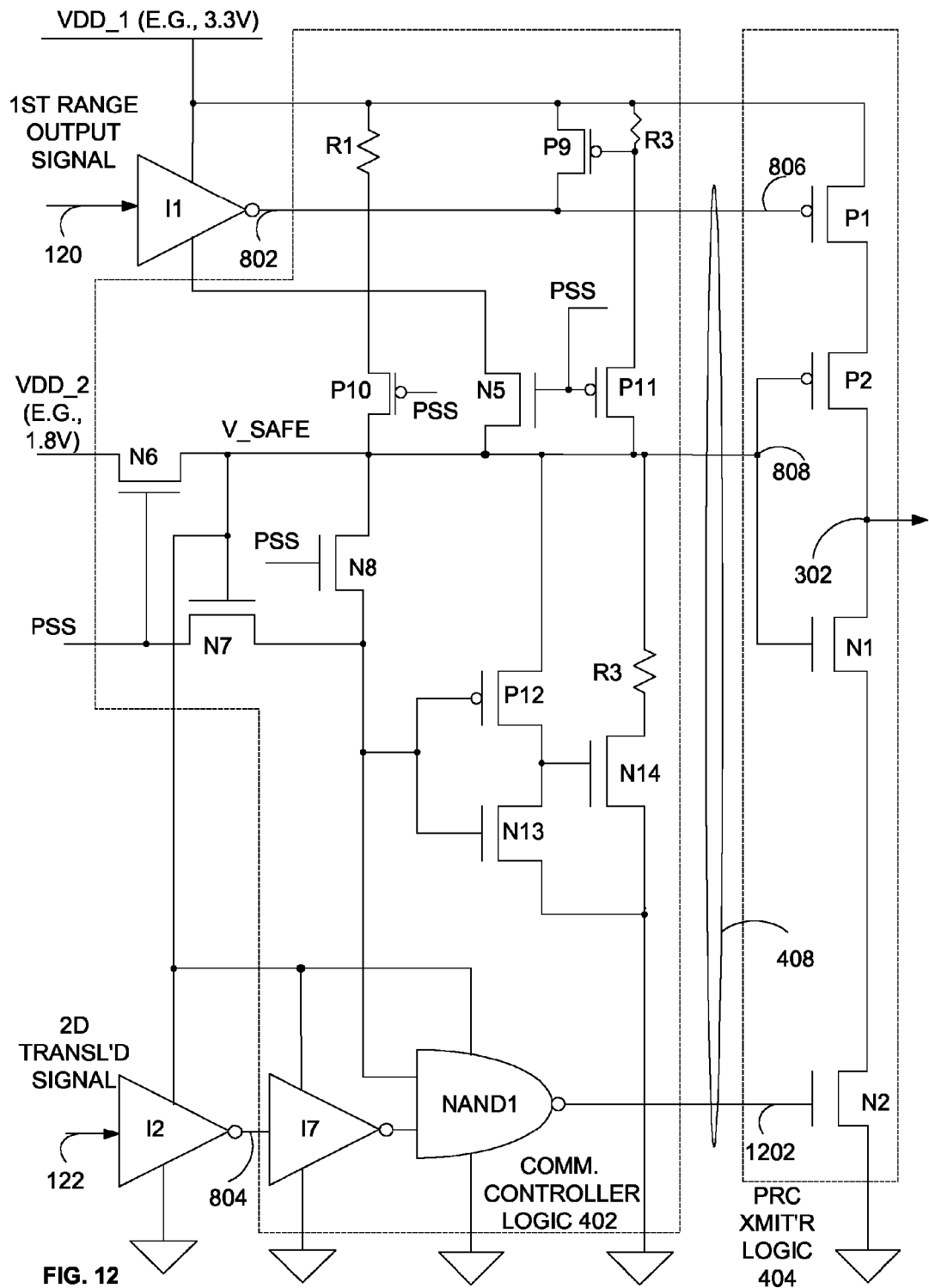
FIG. 12 is a more detailed block diagram and schematic diagram of one embodiment of pre-buffer logic, communication controller logic and power ramp controlled transmitter logic capable of generating a logic zero outgoing communication signal.

FIG. 6 is a first portion of a schematic diagram of power ramp sensor logic 304 in accordance with one embodiment of the present disclosure. FIG. 7 is a final portion of a schematic diagram of power ramp sensor logic 304 in accordance with FIG. 6. The power ramp sensor logic 304 of FIGS. 6 and 7 detects voltage levels of the first voltage source 108 and the second voltage source 110. Accordingly, this specific power ramp sensor logic 304 may be used for power ramp controlled buffer logic 306 that is supplied with and requires both the first and second voltage sources 108 and 110 (i.e., power ramp controlled buffer logic 306 is composed of 1X transistors). Such a power ramp controlled buffer logic 306 is illustrated in FIGS. 8, 11 and 12.

Figure 8:
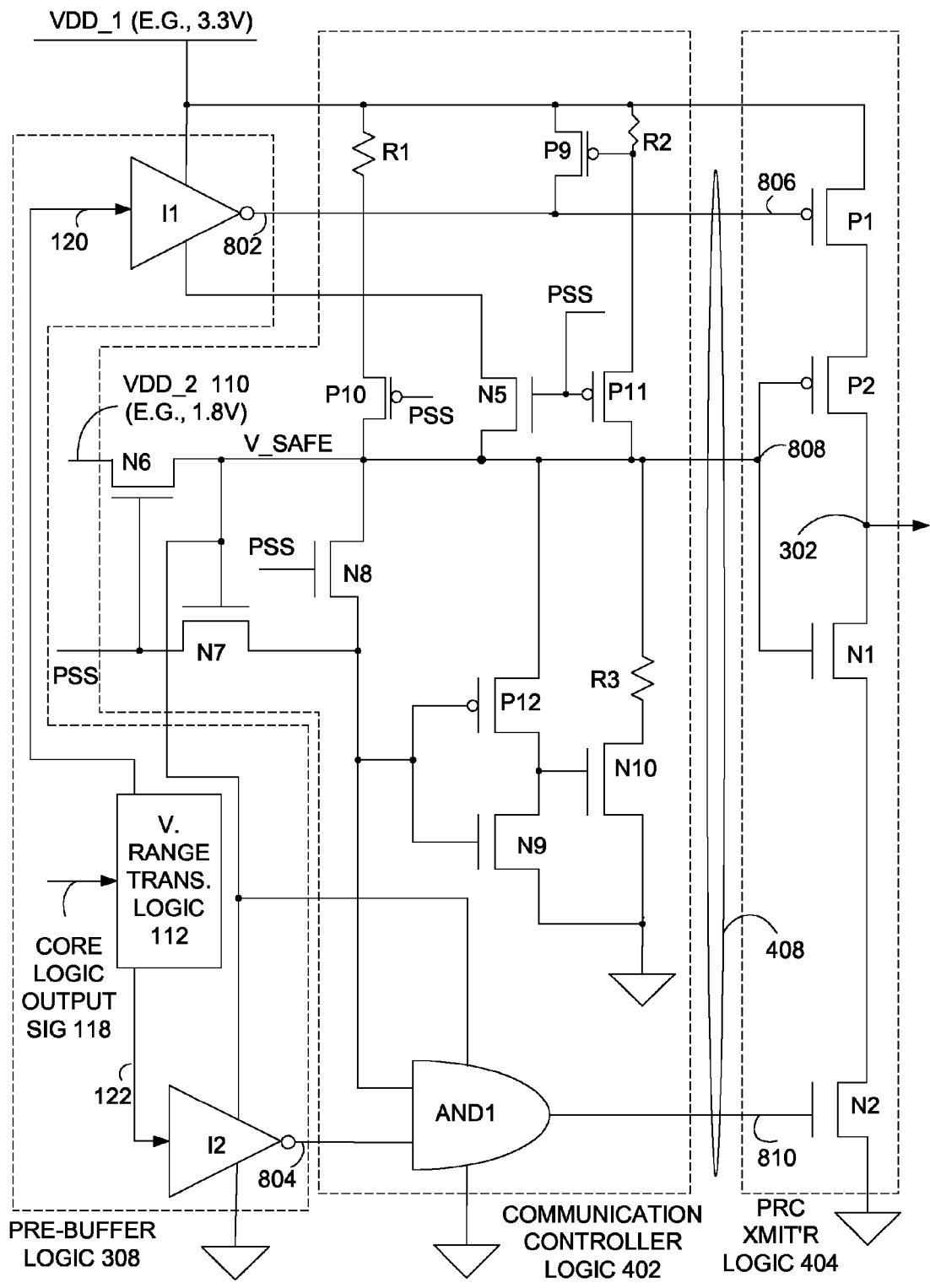
FIG. 8 is a more detailed block diagram and schematic diagram of one embodiment of pre-buffer logic, communication controller logic and power ramp controlled transmitter logic capable of generating a tristated outgoing communication signal.

Collectively, the power ramp sensor logic 304 of FIGS. 6 and 7 includes a plurality of nmos and pmos transistors labeled MN1-MN4, MP1-MP4 (in FIG. 6) and N3-N5 and P3-P8 (in FIG. 8). The power ramp sensor logic 304 of FIGS. 6 and 7 also includes three inverter circuits I3-I5. In one embodiment, inverter circuits I3-I5 may be implemented using nmos and pmos technology. It is recognized that other implementation techniques may be used to implement the power ramp sensor logic 304 of FIGS. 6-7, however. In the specific implementation of FIGS. 6 and 7, each of the transistors that comprise the power ramp sensor logic 304 are 1X transistors.

More specifically, the circuitry of FIG. 6 illustrates a reference voltage generator 600 coupled to a first voltage source 108 of the at least one voltage source 311, wherein the reference voltage generator 600 generates reference voltage 602.

The reference voltage generator 600 was disclosed in U.S. Pat. No. 6,351,182 entitled "Circuit and Method for Providing a Reference Voltage" having application Ser. No. 09/365,570, two common inventors and a common assignee as the current disclosure. The contents of U.S. Pat. No. 6,351,182 are incorporated herein by reference. The voltage of reference voltage 602 is approximately equal to a voltage level of the first voltage source 108 (VDD_1) divided by 2. That is: (voltage of Ref Voltage 602)=(voltage of first Voltage Source 108)/2. The circuitry allows for a stable reference voltage 602 necessary for proper operation of the remainder of the power ramp sensor logic 304 (using 1X transistors) as illustrated in FIG. 7. It is recognized that other voltage dividers or any other suitable logic and/or circuitry may be used in place of the circuitry of FIG. 6.

FIG. 7 illustrates: P3 and P4 coupled in a cross-coupled configuration such that the gate of the P3 is coupled to the gate of P4 and such that first terminals of both P3 and P4 are operatively coupled to the first voltage source 108; a first terminal of P5 coupled to the second terminal of the P3; the gate of P3 coupled to receive the reference voltage 602; the gate of P6 coupled to the second terminal of P5; the first terminal of P6 coupled to the second terminal of P3; the second terminal of P6 coupled to receive the reference voltage 602; the gate of P7 coupled to receive the reference voltage 602; the first terminal of P7 coupled to the second terminal of P4; the gate of P8 coupled to the second terminal of P7; the first terminal of P8 coupled to the second terminal of P4; the second terminal of P8 coupled to receive the reference voltage 602; the gate of N3 coupled to receive the reference voltage 602; the first terminal of N3 coupled to the gate of P6; the gate of N4 coupled to receive the reference voltage 602; the first terminal of N4 coupled to the gate of P8; a voltage signal at the first terminal of the N4 represents the power status signal 314; an input of I3 coupled to a second voltage source 110 of the at least one voltage source 311; the output of I3 coupled to the second terminal of N3; wherein I3 is coupled between the reference voltage 602 and a ground; an input of I4 coupled to the second voltage supply 110; wherein I4 is coupled between the reference voltage 602 and the ground; an input of I5 coupled to the output of I4; an output of I5 coupled to the second terminal of N4; wherein I5 is coupled between the reference voltage 602 and the ground.

One having ordinary skill in the art will recognize that, as configured in FIGS. 6 and 7, the power ramp sensor logic 304 generates the power status signal 314 in a first state (i.e., a logic zero or 0 V) when each of the detected voltage levels are less than a corresponding predetermined voltage level. Similarly, the power ramp sensor logic 304 generates the power status signal 314 in a high state (i.e., a logic one at the voltage level of the first voltage source 108) when each of the detected voltage levels are greater than or equal to the predetermined voltage level. When the first voltage source 108 corresponds to 3.3 V and the second voltage source 110 corresponds to 1.8 V, the predetermined voltage levels represent the necessary amount of voltage to turn on the 1X transistors illustrated in FIGS. 6 and 7. In other words the predetermined voltage levels may correspond to the ramped-up voltage level of each of the first and second voltage source 108 and 110 (i.e., 3.3 V and 1.8 V, respectively) minus a threshold voltage value of the corresponding nmos and pmos transistors (often a fraction of a volt).

The following truth table reflects the operation of the power ramp sensor logic 304 of FIGS. 6 and 7.

| VDD_1 | VDD_2 | PSS |
|---|---|---|
| 0 ≤ VDD_1 < (Predetermined voltage level of VDD_1) | 0 ≤ VDD_2 < (Predetermined voltage level of VDD_2) | 0 V (logic zero) |
| 0 ≤ VDD_1 < (Predetermined voltage level of VDD_1) | VDD_2 ≥ (Predetermined voltage level of VDD_2) | 0 V (logic zero) |
| VDD_1 ≥ (Predetermined voltage level of VDD_1) | 0 ≤ VDD_2 < (Predetermined voltage level of VDD_2) | 0 V (logic zero) |
| VDD_1 ≥ (Predetermined voltage level of VDD_1) | VDD_2 ≥ (Predetermined voltage level of VDD_2) | Voltage of VDD_1 (logic one) |

FIG. 8 is a more detailed block diagram and schematic diagram of one embodiment of pre-buffer logic 308, communication controller logic 402 and power ramp controlled transmitter logic 404 capable of generating a tristated outgoing communication signal 302 using 1X transistors. It is recognized, however, that the voltage range translator logic 112 may use any suitable transistors in addition to or in place of the 1X transistors in order to provide the first and second translated signals 120 and 122. Any suitable modification may be made to account for these additional/substitute transistors. Accordingly, each of the pre-buffer logic 308 and the communication controller logic 402 are coupled to both the first voltage source (VDD_1) 108 and the second voltage source (VDD_2) 110. Furthermore, the power ramp sensor 304 of FIGS. 6 and 7 may be used to supply the power status signal 314 to the communication controller logic 402 because the power status signal 314 of FIGS. 7 and 8 reflects the detected voltage levels of the first voltage source (VDD_1) 108 and the second voltage source (VDD_2) 110.

Pre-buffer logic 308 includes the voltage range translator logic 112 and first and second inverter circuits I1 and I2 coupled in the manner shown in FIG. 8. Pre-buffer logic 308 receives the at least one core logic output signal 118 as described above with respect to FIG. 1 and generates a first pre-buffer logic control signal 802 and a second pre-buffer logic control signal 804. During normal operational mode, the first and second pre-buffer logic control signals 802 and 804 are respectively similar to the similar signals illustrated in FIG. 1 bearing numbers 124 and 126. It is recognized that the lower voltage supply of the first inverter circuit I1 and the upper voltage supply of the second inverter circuit I2 are now coupled to the communication controller logic 402 instead of to the second voltage source (VDD_2) 108 as illustrated in FIG. 1.

More specifically, pre-buffer 308 of FIG. 8 illustrates that the input of I1 is coupled to receive the first translated signal 120 while the output of I1 is the first pre-buffer logic output control signal 802, wherein I1 is coupled between the first voltage source 108 and communication controller logic 402 (first terminal of N5). The input of I2 is coupled to receive the second translated signal 122 while the output of I2 is the second pre-buffer logic output control signal 804, wherein I2 is coupled between the communication controller logic 402 (gate of N7) and a ground.

Communication controller logic 402 includes an AND gate circuit AND 1, a first, second and third resistor (R1, R2 and R3), a plurality of pmos transistors (P9-P12) and a plurality of nmos transistors (N5-10) coupled in the manner shown in FIG. 8. The resistance values of R1, R2 and R3 may be any suitable value as known to one having ordinary skill in the art. Communication controller logic 402 is coupled to the first and second voltage sources 108 and 110 and is further coupled to receive the power status signal 314, the first pre-buffer logic output control signal 802 and the second pre-buffer logic output control signal 804. As is diagrammatically illustrated, communication logic 402 generates a first controller logic output control signal 806, a second controller logic output control signal 808 and a third controller output control signal 810. As appreciated by one having ordinary skill in the art and in view of FIG. 8, the first, second and third controller logic output control signals 806, 808 and 810 (collectively, the at least one controller logic output control signal 408) control the power ramp controlled transmitter logic 404 by controlling the gates of P1, P2, N1 and N2.

More specifically, communication controller logic 402 of FIG. 8 illustrates: the first terminal of R1 coupled to a first voltage source 108 of the at least one voltage source 311; the first terminal of R2 coupled to the first voltage source 108; the gate of P9 coupled to the second terminal of R2; the first terminal of P9 coupled to the first voltage source 108; the second terminal of P9 coupled to the first pre-buffer logic output control signal 802; wherein a voltage signal at the second terminal of P9 represents the first controller logic output control signal 806; the gate of P10 coupled to receive the power status signal 314; the first terminal of P10 coupled to the second terminal of R1; the gate of P11 coupled to receive the power status signal 314; the first terminal of P11 coupled to the second terminal of R2; the first terminal of P12 coupled to the second terminal of P11; the first terminal of R3 coupled to the second terminal of P11; the gate of N5 coupled to receive the power status signal 314; the first terminal of N5 coupled to the pre-buffer logic 308; the second terminal of N5 coupled to the second terminal of P11; the gate of N6 coupled to receive the power status signal 314; the first terminal of N6 coupled to a second voltage source 110 of the at least one voltage source 311; the second terminal of N6 coupled to the second terminal of P10 and to the second terminal of N5; wherein a voltage signal at the second terminal of N6 represents the second controller logic output control signal 808; the gate of N7 coupled to the second terminal of N6; the first terminal of N7 coupled to receive the power status signal 314; the gate of N8 coupled to receive the power status signal 314, the first terminal of N8 coupled to the second terminal of P10; the second terminal of N8 coupled to the second terminal of N7; the gate of N9 coupled to the gate of P12 and to the second terminal of N8; the first terminal of N9 coupled to the second terminal of P12; the second terminal of N9 coupled to a ground; the gate of N10 coupled to the second terminal of P12; the first terminal of N10 coupled to the second terminal of R3; the second terminal of N10 coupled to the ground; the first input terminal of AND1 coupled to the second terminal of N8; the second input terminal of AND1 coupled to receive the second pre-buffer output signal 804; wherein AND1 is coupled between the gate of N7 and the ground; the output of AND1 represents the third controller logic output control signal 810.

Power ramp controlled transmitter logic 404 includes a plurality of pmos transistors (P1-P2) and a plurality of nmos transistors (N1-N2) configured in the cascaded manner as illustrated with respect to transmitter logic 104 of FIG. 1. However, unlike the transmitter logic 104, the power ramp controlled transmitter logic 404 receives and is controlled by the first, second and third controller output control signals 806-810. The first controller output control signal 806 is coupled to the gate of P1; the second controller output control signal 808 is coupled to the gates of P2 and N1; the third controller output control signal 810 is coupled to the gate of N2. The power ramp controlled transmitter logic 404 of FIG. 8 generates an outgoing communication signal 302 wherein when the power status signal is in a first state (i.e., a ramping up operation mode) the outgoing communication signal 302 is a tristate outgoing communication signal. However, when the power status signal is in a second state (i.e., a normal operation mode) the outgoing communication signal 302 is based on the at least one core logic output signal 118. That is, during normal operation mode, the outgoing communication signal 302 corresponds to the transmission information present in or otherwise associated with the at least one core logic output signal 118.

During normal operation and when the at least one core logic output signal 118 includes transmission information, the first pre-buffer logic output signal 802 will inversely (due to inverter circuit I1) mimic or mirror the voltage levels of the transmission information in the at least one core logic output signal 118 but with a logic one value of the voltage level of the first voltage source (VDD_1) 108. Similarly, during the normal operational mode, the second pre-buffer logic output signal 804 will inversely (due to inverter circuit I2) mimic or mirror the voltage levels of the transmission information associated with the at least one core logic output signal 118. Also during normal operational mode, when the at least one core logic output signal 118 includes control information (e.g., to disable the controlled transmitter logic 104), the voltage range translator logic 112 may be used to send the appropriate first and second translated signal 120 and 122 to the first and second inverter circuits I1 and I2 (e.g., a logic zero and logic one, respectively).

The following summary reflects the operation of communication controller logic 402 and power ramp controlled transmitter logic 404 of FIG. 8 during and immediately after a ramping up operational mode. Based on this summary and the block/schematic diagram of FIG. 8, one having ordinary skill in the art will recognize the corresponding operation during a ramping down operational mode. When the voltage level of the first voltage source 108 is 0 V, the outgoing communication signal 302 will always have a tristated value and therefore be a tristated outgoing communication signal. This is true regardless of the voltage seen on the second voltage source 110 because the power status signal 314 is 0 V and I1 and I2 are disabled.

As the first and second voltage sources 108 and 110 begin to ramp up to their respective final voltage values of VDD_1 (e.g., 3.3 V) and VDD_2 (e.g., 1.8 V), but before the voltages on each source exceed their predetermined points (e.g., the voltage thresholds of the transistors), the power status signal (PSS) 314 is in a low state (e.g., 0V). As the first voltage source 108 begins ramping (while PSS=0V), P10 will turn on causing N7 to turn on to provide 0V to the gates of P12 and N9. N9 will be off while P12 will be on to provide a voltage to the gate of N10, thereby turning N10 on. Together, R1, P10 (on), R2 and N10 (on) form a voltage divider to keep the potential at the gates of P2 and N1 (i.e., the second controller logic output control signal 808 and also labeled V_SAFE) at the level of approximately (VDD_1)/2 even if the second voltage source has not begun ramping yet. Note that at this point, N6 is off and that the first AND gate circuit AND1 receives a 0V level as one of its inputs because N7 is on. Accordingly, the third controller logic output signal 810 will be 0V, turning off N2. In other words, I2 is disconnected from the power ramp controlled transmitter 404. Also, P11 will be on allowing the V_SAFE voltage to go to the gate of P9, thereby turning it on and providing the current voltage of the first voltage source (VDD_1) 108 at the gate of P1. In other words, the first controller logic output control signal 806 will be the current voltage of the first voltage source (VDD_1) 108. P1 will be turned off. Note, that at the same time, N5 is off to disconnect the first inverter circuit I1 (more specifically the low voltage supply of I1) from the V_SAFE voltage level. Accordingly, during this point in time, the outgoing communication signal 302 is tristated.

As soon as the voltage levels on each of the first and second voltage sources 108 and 110 ramp to the point where each source 108 and 110 has a voltage level beyond their respective predetermined points as discussed above (i.e., as they approach 3.3 V and 1.8 V, respectively), the power status signal will change state as discussed with respect to FIGS. 6 and 7. The power status signal will now track the voltage level of the first voltage source (VDD_1) 108 (~3.3 V). At this point, N6 will turn on and P10 and P11 will turn off such that the V_SAFE voltage will be approximately equal to the voltage level of the second voltage source (VDD_2) 110 (1.8 V). Also, N5 will turn on to return the first inverter circuit I1 to normal operation (by providing a low voltage supply). N8 will turn on to provide the V_SAFE voltage to the gates of P12 and N9. P12 will turn off and N9 will turn on, thereby turning N10 off and disconnecting R3 from ground. This prevents static leakage current through R1 and R3 during normal operation mode. Accordingly, at this point, the communication controller logic 402 no longer interferes with the first and second pre-buffer logic output control signals 802 and 804. In other words, the first controller logic output control signal 806 is the same as the first pre-buffer logic output control signal 802; the second controller logic output control signal 808 is the same as the voltage level of the second voltage source (VDD_2) 110 (AKA V_SAFE at this time); and the third controller logic control signal 810 is the same as the second pre-buffer logic output control signal 804. Accordingly, the at least one core logic output signal 118 controls the power ramp transmitter logic 404 using the pre-buffer logic 308.

Figure 9:
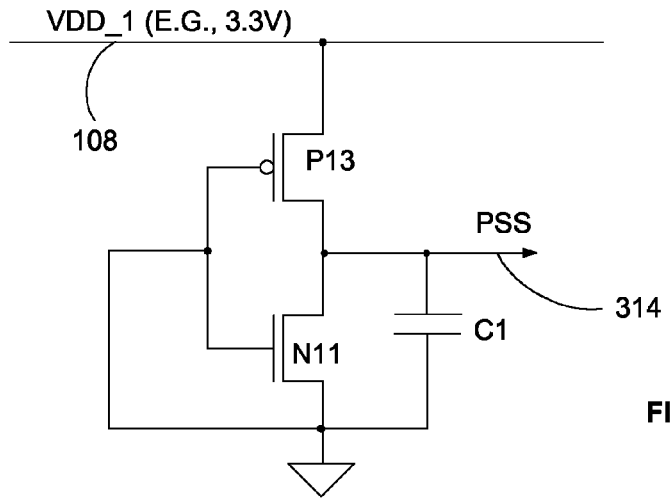
FIG. 9 is a schematic diagram of power ramp sensor logic in accordance with another embodiment of the present disclosure.

FIG. 9 is a schematic diagram of power ramp sensor logic 304 for use with power ramp controlled communication buffer logic 306 that requires only one voltage supply: the first voltage supply (VDD_1) 108 (e.g., 3.3 V) in accordance with another embodiment of the present disclosure. The power ramp sensor logic 304 of FIG. 9 includes 2X transistors: P13 and Nil. P13, a pmos transistor, and N11, an nmos transistor, are coupled together in series such that the gates of each of P13 and N11 are coupled and such that the second terminal of P13 and the first terminal of N11 are coupled. The first terminal of P13 is coupled to the first voltage source 108 and the second terminal of N11 is coupled to a ground and to the gates of P13 and Nil. Capacitor C1 is coupled between the first and second terminals of N11. The voltage level seen at the first terminal of N11 is the voltage level of the power status signal 314. The capacitance value of C1 may be any suitable value as recognized by one having ordinary skill in the art.

The power ramp sensor logic 304 of FIG. 9 operates to detect the voltage of the first voltage source 108 and to generate the power status signal 314. The power status signal is in a first state (i.e., logic zero or 0V) when the detected voltage is less than a predetermined point as discussed above. The power status signal is in a second state (i.e., a logic one at the voltage level of the first voltage source 108) when the detected voltage is greater than or equal to the predetermined point. The predetermined voltage level may correspond to the ramped-up voltage level of the first and second voltage source 108 (i.e., 3.3 V and 1.8 V, respectively) minus a threshold voltage value of the corresponding nmos and pmos transistors. The following truth table illustrates this operation:

| VDD_1 | PSS |
|---|---|
| 0 ≤ VDD_1 < (Predetermined voltage level of VDD_1) | 0 V (logic zero) |
| VDD_1 ≥ (Predetermined voltage level of VDD_1) | Voltage of VDD_1 (logic one) |

Figure 10:
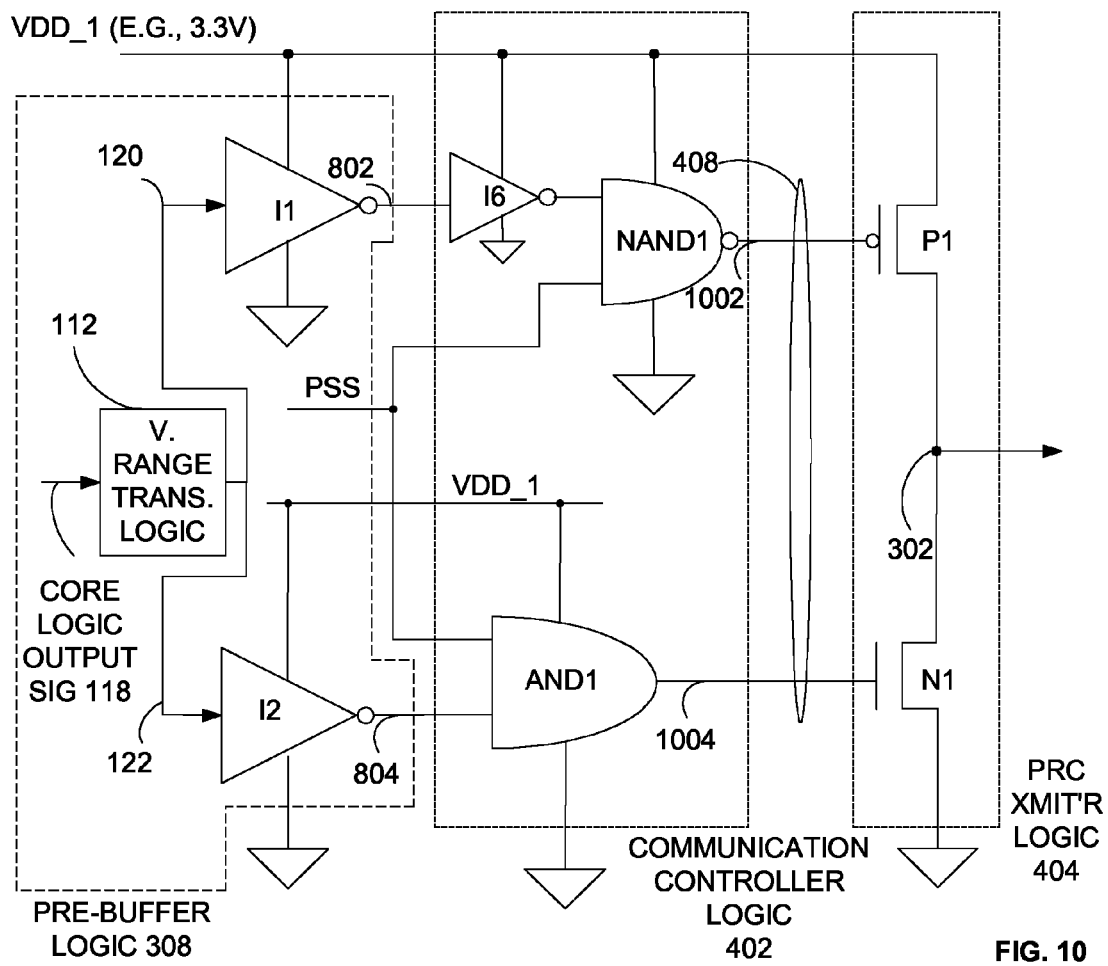
FIG. 10 is a more detailed block diagram and schematic diagram of another embodiment of pre-buffer logic, communication controller logic and power ramp controlled transmitter logic capable of generating a tristated outgoing communication signal.

FIG. 10 is a more detailed block diagram and schematic diagram of another embodiment of pre-buffer logic 308, communication controller logic 402 and power ramp controlled transmitter logic 404 capable of generating a tristated outgoing communication signal using 2X transistors. It is recognized, however, that the voltage range translator logic 112 may use any suitable transistors in addition to or in place of the 2X transistors in order to provide the first and second translated signals 120 and 122. Any suitable modification may be made to account for these additional/substitute transistors. Each of the pre-buffer logic 308, the communication controller logic 402 and the power ramp controlled transmitter logic 404 are coupled to the first voltage source (VDD_1) 108. In one embodiment, the power ramp sensor 304 of FIG. 9 is used to supply the power status signal 314 to the communication controller logic 402 because the power status signal 314 of FIG. 9 reflects the detected voltage level of the first voltage source (VDD_1) 108.

Pre-buffer logic 308 was previously described with reference to FIGS. 1 and 8. Communication controller logic 402 includes: a sixth inverter circuit I6, a NAND gate circuit NAND1 and an AND gate circuit AND1. Communication controller logic 402 is coupled to the first voltage source 108 and is further coupled to receive the power status signal 314, the first pre-buffer logic output control signal 802 and the second pre-buffer logic output control signal 804. As is diagrammatically illustrated, communication controller logic 402 generates a fourth controller logic output control signal 1002 and a fifth controller logic output control signal 1004 (collectively, the at least one controller logic output control signal 408). As appreciated by one having ordinary skill in the art and in view of FIG. 10, the fourth and fifth controller logic output control signals 1002 and 1004 control the power ramp controlled transmitter logic 404 by controlling the gates of P1 and N1.

More specifically, communication controller logic 402 of FIG. 10 illustrates: the first input of AND1 coupled to receive the second pre-buffer logic output control signal 804; the second input of AND1 coupled to receive the power status signal 314; the output of AND1 representing the fifth controller logic output control signal 1004; wherein AND1 is coupled between a first voltage source 108 of the at least one voltage source 311 and a ground; an input of I6 coupled to receive the first pre-buffer logic output control signal 802; wherein I6 is coupled between the first voltage source 108 and the ground; a first input of NAND1 coupled to the output of I6; a second input of NAND 1 coupled to receive the power status signal 314; the output of NAND1 representing the fourth controller logic output control signal 1002; wherein the NAND1 is coupled between the first voltage source 108 and the ground.

Power ramp controlled transmitter logic 404 includes one pmos transistor P1 and one nmos transistor N1 configured in series as illustrated. As previously stated, these transistors are 2X transistors. The power ramp controlled transmitter logic 404 receives and is controlled by the fourth and fifth controller output control signals 1002-1004. Fourth controller output control signal 1002 is coupled to the gate of P1. Fifth controller output control signal 1004 is coupled to the gate of N1. The first terminal of P1 is coupled to the first voltage source 108. The second terminal of P1 is coupled to the first terminal of N1, wherein the voltage level at this node represents the outgoing communication signal 302. The second terminal of N1 is coupled to ground.

The power ramp controlled transmitter logic 404 of FIG. 10 generates an outgoing communication signal 302 wherein, when the power status signal 314 is in a first state (ramping operation modes), the outgoing communication signal 302 is a tristate outgoing communication signal. However, when the power status signal 314 is in a second state (normal operation mode), the outgoing communication signal 302 is based on the at least one core logic output signal 118. That is, during normal operation mode, the outgoing communication signal 302 corresponds to the transmission information present in or otherwise associated with the at least one core logic output signal 118.

When the at least one core logic output signal 118 includes transmission information, the first pre-buffer logic output signal 802 will inversely (due to I1) mimic or mirror the voltage levels of the transmission information in the at least one core logic output signal 118 but with a logic one value of the voltage level of the first voltage source (VDD_1) 108. The logic zero value of the first pre-buffer logic output signal 802 is the voltage value of the ground. Similarly, the second pre-buffer logic output signal 804 will inversely (due to I2) mimic or mirror the voltage levels of the transmission information associated with the at least one core logic output signal 118 but with a logic one value of the voltage level of the first voltage source (VDD_1) 108 and with a logic zero value of the ground. As discussed above, however, when the at least one core logic output signal 118 includes control information (e.g., to disable the controlled transmitter logic 104), the voltage range translator logic 112 may be used to send the appropriate first and second translated signal 120 and 122 to the first inverter circuit I1 and the second inverter circuit I2.

The following summary reflects the operation of the communication controller logic 402 and the power ramp controlled transmitter logic 404 of FIG. 10 during and immediately after a ramping up operational mode. Based on this description and on the block/schematic illustration of FIG. 10, one having ordinary skill in the art will recognize the corresponding operation during a ramping down operational mode. When the voltage level of the first voltage source 108 is 0 V, the outgoing communication signal 302 will always have a tristated value and therefore be a tristated outgoing communication signal. This is true regardless of the voltage seen on the second voltage source 110. During this period, the communication controller logic 402 is said to "block" the at least one core logic signal 118. During voltage ramp up, the voltage level on the first voltage source 108 will begin to increase. When the voltage level increases to at least the predetermined point, the power status signal 314 will become a logic one value with a voltage level of the first voltage source (VDD_1) 108. At that point, one having ordinary skill in the art will recognize that the communication controller logic 402 will not longer "interfere" with the at least one core logic signal 118. That is, the at least one core logic output signal 118 will direct the operation of the power ramp controlled transmitter logic 404.

FIG. 11 is a more detailed block diagram and schematic diagram of one embodiment of a portion of the pre-buffer logic 308, communication controller logic 402 and power ramp controlled transmitter logic 404 capable of generating a logic one outgoing communication signal using 1X transistors (and thus using a power status signal 314 such as the one generated in FIGS. 6 and 7). FIG. 11 contains all of the components of FIG. 8 but for R3 and P9. Accordingly, one having ordinary skill in the art will recognize that the discussion above with respect to FIG. 8 is applicable to the elements of FIG. 11 bearing same numerals and alpha-numerals. However, because R3 and P9 are not part of the communication controller 402 of FIG. 1, a different voltage value is provided to the gate of P1 than that described with reference to FIG. 8. This voltage value is the termed sixth controller logic output control signal 1102. Sixth controller logic output control signal 1102 allows the power ramp controller transmitter 408 to transmit a logic one outgoing communication signal at the voltage level of the first voltage source (VDD_1) 108 during ramping operational modes instead of a tristated outgoing communication signal.

FIG. 12 is a more detailed block diagram and schematic diagram of one embodiment of a portion of pre-buffer logic 308, communication controller logic 402 and power ramp controlled transmitter logic 404 capable of generating a logic zero outgoing communication signal using 1X transistors (and thus using a power status signal 314 such as the one generated in FIGS. 6 and 7). FIG. 12 contains all of the components of FIG. 8 but adds a seventh inverter circuit I7 and substitutes first NAND gate circuit NAND1 for the first AND gate circuit AND1. I7 is coupled between the output of second inverter circuit I2 and NAND1. The output of I2 is coupled to the input of I7. The output of I7 is coupled to the second input of NAND1. I7 is coupled between the gate of N7 and the ground. The first input of NAND1 is coupled to the second terminal of N8. Accordingly, one having ordinary skill in the art will recognize that the discussion above with respect to FIG. 8 is applicable to the elements of FIG. 12 bearing same numerals and alpha-numerals. However, because seventh inverter circuit I7 is now part of the communication controller 402 of FIG. 12, a different voltage value is provided to the gate of N2. This voltage value is termed seventh controller logic output control signal 1202. The seventh controller logic output control signal 1202 allows the power ramp controller transmitter 408 to transmit a logic zero outgoing communication signal during ramping operational modes instead of a tristated outgoing communication signal.

Figure 13:
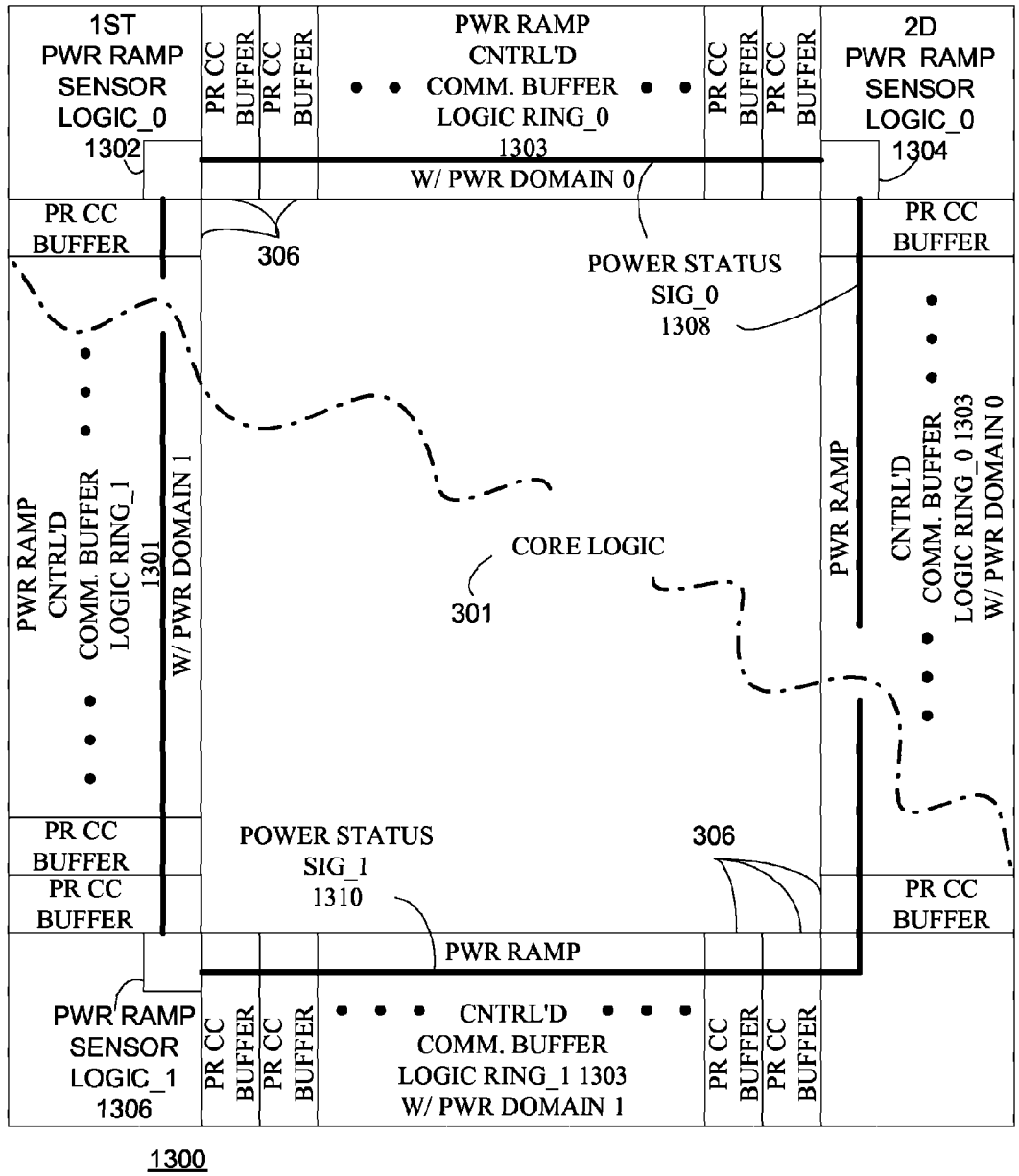
FIG. 13 is a block diagram of an integrated circuit having at least one core logic and two different communication buffer logic rings in accordance with one embodiment of the present disclosure.

FIG. 13 is a block diagram of an integrated circuit 1300 having at least one core logic 1301 and two different communication buffer logic rings: logic ring_0 1301 and logic ring_1 1303 in accordance with one embodiment of the present disclosure. Each of the logic rings 1301 and 1303 may be associated with a different power domain such as power domain 0 and power domain 1 such that the at least one core logic 1301 is capable of transmitting and/or receiving outgoing and incoming communication signals at voltage levels associated with the power domains. Each ring is associated with a plurality of power ramp controlled communication buffer logic units 306 each associated with at least one power ramp sensor logic 1302-1306 capable of detecting at least one voltage source for the associated power ramp controlled communication buffer logic units 306 and capable of generating a power status signal 1308 or 1310 that is distributed on a network to various power ramp controlled communication buffer logic units 306 throughout the integrated circuit 1300, as illustrated. Each of the power ramp sensor logic units 1302-1306 may be identical to or similar to power status sensor logic 304 as described above. Power domain 0 is illustrated as having two power ramp sensor logic units 1302 and 1304 to avoid adverse voltage drop effects as recognized by one having ordinary skill in the art. Similarly, each of the power ramp controlled communication buffer logic units 306 operates in accordance with the above description to control communication signals. Accordingly, integrated circuit 1300 provides greater versatility than that of integrated circuit 200.

Accordingly, a method and apparatus have been disclosed that controls a communication signal. The communication signal may be an outgoing communication signal or an incoming communication signal. The method and apparatus control the generation of the outgoing communication signal based on detected voltage levels of the voltage sources that are necessary to supply the power ramp controlled communication buffer logic. In one embodiment, the outgoing communication signals may further be based on at least one core logic output signal. The method and apparatus control the generation of a core logic input signal based on an incoming communication signal also based on the detected voltage levels of the same voltage sources.

By basing the control of the communication signals on the detected voltages of the at least one voltage source, the pitfalls of the prior art communication buffer logic units are avoided. That is, during ramping periods, the outgoing communication signals and the core logic input signals are not corrupted based on the low voltage seen on the at least one voltage source. The power ramp controlled communication buffer logic of the current disclosure also benefits to the extent that it is not a weak external switch as described above; it neither suffers from the cost associated with such switches nor from inability to match impedances to limit reflection on the traces.

Although the present disclosure was described as implemented on a single integrated circuit, the term integrated circuit, as acknowledged above, may include one or more integrated circuits. Accordingly, it is conceived that the disclosure may be implemented in a number of different configurations.

It is further acknowledged that although the present disclosure discussed the detection of at the voltage sources that supply power to the power ramp controlled communication buffer logic, minor adjustments could be made by one having ordinary skill in the art in order to detect other voltages and to base the generation of outgoing communication signals and core logic input signals on these detected voltages. For example, it is conceived that the core logic voltage may be detected by the power sensor logic in the same manner as the other voltage sources were detected. This may be particularly useful in the receiver solution wherein a core logic input signal is generated. By knowing that the core logic voltage supply is suitably high enough, a circuit designer could rest assured that its core logic could suitably process any signals it sends the core logic.

It should be understood that these and other advantages may be obtained by the above disclosure; the invention is not limited by the specific embodiments described above. The implementation of other variations and modifications of the disclosure in its various aspects will be apparent to those of ordinary skill in the art.

What is claimed is:

1. An integrated circuit capable of controlling a communication signal, the integrated circuit comprising:

I/O voltage supply power ramp controlled communication buffer logic powered by at least one I/O voltage source, the I/O voltage supply power ramp controlled communication buffer logic including communication controller logic operatively coupled to I/O voltage supply power ramp sensor logic and operative to generate a controller logic output control signal in response to a detected voltage level for each of the at least one I/O voltage source, wherein the I/O voltage supply power ramp controlled communication buffer logic is operative to generate an outgoing communication signal in response to the controller logic output control signal; and wherein the outgoing communication signal is:
a predetermined outgoing communication signal when the detected voltage level for each of the at least one I/O voltage source is below a corresponding predetermined voltage level; and is based on at least one core logic output signal when the detected voltage level for each of the at least one I/O voltage source is greater than or equal to the corresponding predetermined voltage level.

2. The integrated circuit of claim 1, wherein the predetermined outgoing communication signal is one of: a tristated outgoing communication signal, a logic one outgoing communication signal and a logic zero outgoing communication signal.

3. The integrated circuit of claim 1, further comprising:
I/O voltage supply power ramp sensor logic operatively coupled to the at least one I/O voltage source and operative to detect a voltage level for each of the at least one I/O voltage source and further operative to generate a power status signal based on the detected voltage level for each of the at least one I/O voltage source; and
wherein the I/O voltage supply power ramp controlled communication buffer logic is operative to generate the outgoing communication signal in response to the power status signal.

4. The integrated circuit of claim 1, wherein each corresponding predetermined voltage level is associated with a predetermined point in a voltage ramp of the corresponding one of the at least one I/O voltage source.

5. The integrated circuit of claim 1, further comprising core logic operatively coupled to the I/O voltage supply power ramp controlled communication buffer logic, wherein the core logic is operative to generate the at least one core logic output signal, and wherein the at least one core logic output signal contains at least one of: transmission information and control information.

6. The integrated circuit of claim 1, wherein the I/O voltage supply power ramp controlled communication buffer logic is operatively coupled to another integrated circuit; and
wherein the I/O voltage supply power ramp controlled communication buffer logic is operative to transmit the outgoing communication signal to the another integrated circuit.

7. The integrated circuit of claim 6, wherein each of the integrated circuit and the another integrated circuit is one of: a central processor and a graphics processor.

8. A method for controlling a communication signal, the method comprising:
generating a power status signal based on a detected voltage level for each of at least one I/O voltage source;
generating a controller logic output control signal with communication controller logic responsive to the power status signal, the communication controller logic comprised by I/O voltage supply power ramp controlled communication buffer logic powered by the at least one I/O voltage source; and generating an outgoing communication signal in response to the controller logic output control signal, wherein the outgoing communication signal is:
a predetermined outgoing communication signal when the detected voltage level for each of the at least one I/O voltage source is below a corresponding predetermined voltage level; and
based on at least one core logic output signal when the detected voltage level for each of the at least one I/O voltage source is greater than or equal to the corresponding predetermined voltage level; and
transmitting the outgoing communication signal to an integrated circuit.

9. The method of claim 8, wherein the predetermined outgoing communication signal is one of: a tristated outgoing communication signal, a logic one outgoing communication signal and a logic zero outgoing communication signal.

10. The method of claim 8, further comprising:
detecting a voltage level for each of the at least one I/O voltage source.

11. The method of claim 9, wherein each corresponding predetermined voltage level is associated with a predetermined point in a voltage ramp of the corresponding one of the at least one I/O voltage source.

12. An integrated circuit for controlling an outgoing communication signal, the integrated circuit comprising:
I/O voltage supply power ramp sensor logic operatively coupled to at least one I/O voltage source and operative to detect a voltage level for each of the at least one I/O voltage source;
communication controller logic powered by the at least one I/O voltage source and operatively coupled to the I/O voltage supply power ramp sensor logic, wherein the communication controller logic is operative to generate at least one controller logic output control signal in response to the detected voltage level for each of the at least one I/O voltage source; and
I/O voltage supply power ramp controlled transmitter logic operatively coupled to the communication controller logic, wherein the I/O voltage supply power ramp controlled transmitter logic is operative to generate an outgoing communication signal based on the at least one controller logic output control signal;
wherein the outgoing communication signal is:
a predetermined outgoing communication signal when the detected voltage level for each of the at least one I/O voltage source is below a corresponding predetermined voltage level; and based on at least one core logic output signal when the detected voltage level for each of the at least one I/O voltage source is greater than or equal to the corresponding predetermined voltage level.

13. The integrated circuit of claim 12, wherein:
the I/O voltage supply power ramp sensor logic is further operative to generate a power status signal based on the detected voltage level for each of the at least one I/O voltage source; and
the communication controller logic is operative to generate the at least one controller logic output control signal based on the core logic output signal and the power status signal.

14. The integrated circuit of claim 12, wherein the predetermined outgoing communication signal is one of: a tristated outgoing communication signal, a logic one outgoing communication signal and a logic zero outgoing communication signal.

15. The integrated circuit of claim 12, wherein each corresponding predetermined voltage level is associated with a predetermined point in a voltage ramp of the corresponding one of the at least one I/O voltage source.

16. The integrated circuit of claim 12, further comprising core logic operatively coupled to the I/O voltage supply power ramp controlled communication buffer logic, wherein the core logic is operative to generate the at least one core logic output signal, and wherein the at least one core logic output signal contains at least one of: transmission information and control information.

17. The integrated circuit of claim 12, wherein:
the I/O voltage supply power ramp controlled transmitter logic is operatively coupled to another integrated circuit; and
wherein the I/O voltage supply power ramp controlled transmitter logic is operative to transmit the outgoing communication signal to the another integrated circuit.

18. The integrated circuit of claim 13, further comprising:
pre-buffer logic operatively coupled to one of: the communication controller logic and core logic, wherein the core logic is operative to generate the at least one core logic output signal, and wherein the at least one core logic output signal contains at least one of: transmission information and control information;
wherein the pre-buffer logic is operative to generate at least one pre-buffer logic output control signal based on the at least one core logic output signal such that when the detected voltage level for each of the at least one I/O voltage source is above the predetermined voltage level, the at least one pre-buffer logic output control signal inversely mirrors the at least one core logic signal; and
wherein the communication controller logic is operative to generate the at least one controller logic output control signal in response to the power status signal by generating the at least one controller logic output control signal in response to the at least one pre-buffer logic output control signal and the power status signal.

19. The integrated circuit of claim 12, wherein:
each of the communication controller logic and the I/O voltage supply power ramp controlled transmitter logic is composed of one of:
a first plurality of transistors each having three terminals, wherein each transistor of the first plurality of transistors is designed so that a maximum voltage difference between any two terminals of each transistor of the first plurality of transistors does not exceed a voltage level of a first I/O voltage source of the at least one I/O voltage source plus a first predetermined tolerance; and
the first plurality of transistors and a second plurality of transistors each having three terminals, wherein each transistor of the second plurality of transistors is designed so that a maximum voltage difference between any two terminals of each transistor of the second plurality of transistors does not exceed a voltage level of a second I/O voltage source of the at least one I/O voltage source plus a second predetermined tolerance;

wherein when each of the communication controller logic and the I/O voltage supply power ramp controlled transmitter logic is composed of the first plurality of transistors, the I/O voltage supply power ramp sensor logic is operative to detect the voltage level for each of the at least one I/O voltage source by detecting the voltage level of the first I/O voltage source; and
wherein when each of the communication controller logic and the I/O voltage supply power ramp controlled transmitter logic is composed of the first plurality of transistors and the second plurality of transistors, the I/O voltage supply power ramp sensor logic is operative to detect the voltage level for each of the at least one I/O voltage source by detecting the voltage levels of the first I/O voltage source and the second I/O voltage source.

20. An integrated circuit capable of controlling a communication signal, the integrated circuit comprising:
I/O voltage supply power ramp controlled communication buffer logic powered by at least one I/O voltage source, the I/O voltage supply power ramp controlled communication buffer logic including a communication controller logic operatively coupled to I/O voltage supply power ramp sensor logic and operative to generate a controller logic output control signal in response to a detected voltage level for each of the at least one I/O voltage source, wherein the I/O voltage supply power ramp controlled communication buffer logic is operative to receive an incoming communication signal and to generate a core logic input signal in response to the controller logic output control signal; and
wherein the core logic input signal is:
a predetermined core logic input signal when the detected voltage level for each of the at least one I/O voltage source is below a corresponding predetermined voltage level; and
based on the incoming communication signal when the detected voltage level for each of the at least one I/O voltage source is greater than or equal to the corresponding predetermined voltage level.

21. The integrated circuit of claim 20, wherein the predetermined core logic input signal is one of: a tristated core logic input signal, a logic one core logic input signal and a logic zero core logic input signal.

22. The integrated circuit of claim 20, further comprising:
I/O voltage supply power ramp sensor logic operatively coupled to the at least one I/O voltage source and operative to detect the voltage level for each of the at least one I/O voltage source and further operative to generate a power status signal based on the detected voltage level for each of the at least one I/O voltage source; and
wherein the communication controller logic is operative to generate the controller logic output control signal in response to the power status signal; and
wherein the I/O voltage supply power ramp controlled communication buffer logic comprises:
I/O voltage supply power ramp controlled receiver logic operative to receive the incoming communication signal and to generate the core logic input signal based on the controller logic output control signal.

* * * * *